(12) United States Patent
Choi et al.

(10) Patent No.: US 11,800,789 B2
(45) Date of Patent: Oct. 24, 2023

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: SAMSUNG ELECTRONICS CO., LTD., Suwon-si (KR)

(72) Inventors: Jongwon Choi, Yongin-si (KR); Kum Hee Lee, Suwon-si (KR); Banglin Lee, Suwon-si (KR); Yoonhyun Kwak, Seoul (KR); Ohyun Kwon, Seoul (KR); Sukekazu Aratani, Hwaseong-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 855 days.

(21) Appl. No.: 15/665,884

(22) Filed: Aug. 1, 2017

(65) Prior Publication Data

US 2018/0240990 A1 Aug. 23, 2018

(30) Foreign Application Priority Data

Feb. 23, 2017 (KR) .................. 10-2017-0024279

(51) Int. Cl.
| | |
|---|---|
| H10K 85/30 | (2023.01) |
| C07F 15/00 | (2006.01) |
| C09K 11/06 | (2006.01) |
| H10K 50/11 | (2023.01) |
| H10K 101/10 | (2023.01) |
| H10K 101/30 | (2023.01) |

(52) U.S. Cl.
CPC ....... *H10K 85/346* (2023.02); *C07F 15/0086* (2013.01); *C09K 11/06* (2013.01); *C09K 2211/1029* (2013.01); *C09K 2211/185* (2013.01); *H10K 50/11* (2023.02); *H10K 2101/10* (2023.02); *H10K 2101/30* (2023.02)

(58) Field of Classification Search
None
See application file for complete search history.

(56) References Cited

U.S. PATENT DOCUMENTS

| | | | |
|---|---|---|---|
| 6,465,115 B2 | 10/2002 | Shi et al. | |
| 6,596,415 B2 | 7/2003 | Shi et al. | |
| 2001/0019782 A1 | 9/2001 | Igarashi et al. | |
| 2003/0040627 A1* | 2/2003 | Fujii | C07F 15/0033 546/2 |
| 2003/0068536 A1* | 4/2003 | Tsuboyama | C07F 15/0033 428/704 |
| 2006/0134461 A1 | 6/2006 | Huo et al. | |
| 2007/0103060 A1* | 5/2007 | Itoh | C07F 15/0086 313/504 |
| 2010/0270916 A1* | 10/2010 | Xia | H01L 51/0074 546/10 |
| 2014/0326960 A1* | 11/2014 | Kim | H01L 51/0067 257/40 |
| 2014/0371825 A1 | 12/2014 | Anemian et al. | |
| 2015/0115250 A1 | 4/2015 | Ma et al. | |
| 2016/0013431 A1* | 1/2016 | Choi | H01L 51/0087 257/40 |
| 2016/0268535 A1 | 9/2016 | Rausch et al. | |
| 2017/0054095 A1 | 2/2017 | Choi et al. | |

FOREIGN PATENT DOCUMENTS

| | | |
|---|---|---|
| JP | 2000-003782 A | 7/2000 |
| KR | 10-2014-0117546 A | 10/2014 |

OTHER PUBLICATIONS

M.A. Baldo et al. "Highly efficient phosphorescent emission from organic electroluminescent devices", Nature, 1998, 395, 151.
M.A. Baldo et al. "Very high-efficiency green organic light-emitting devices based on electrophosphorescence", Appl Phys. Lett. 1999, 75(3), 4.
Qin Wang et al. "Effects of charged self-assembled quantum dots on two-diemnsional quantum transport" Appl. Phys. Lett. 2000, 76, 1704.
Raymond C. Kwong et al. "High operational stability of electrophosphorescent devices", Appl. Phys. Lett. 2002, 81, 162.
Sergey Lamansky et al. "Highly Phosphorescent Bis-Cyclometalated Iridium Complexes: Synthesis, Photophysical Characterization, and Use in Organic Light Emitting Diodes", J Am. Chem. Soc. 2001, 123, 4304.
Sergey Lamansky et al. "Synthesis and Characterization of Phosphorescent Cyclometalated Iridium Complexes", Inorg. Chem. 2001, 40, 1704.

* cited by examiner

*Primary Examiner* — Dylan C Kershner
(74) *Attorney, Agent, or Firm* — CANTOR COLBURN LLP

(57) ABSTRACT

An organometallic compound represented by Formula 1:

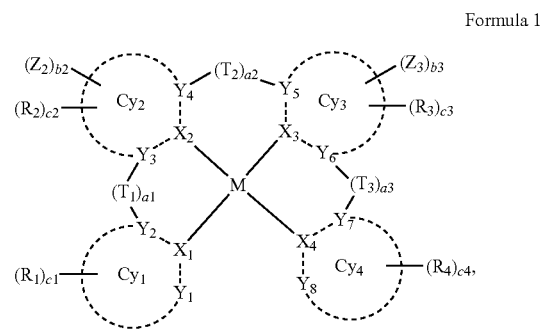

Formula 1 wherein, in Formula 1, groups and variables are the same as described in the specification.

2 Claims, 1 Drawing Sheet

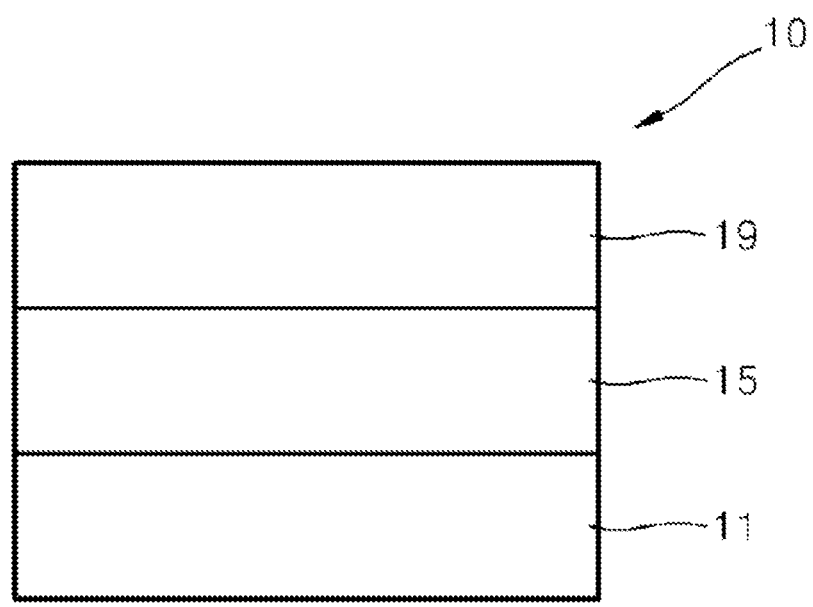

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0024279, filed on Feb. 23, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices which have excellent characteristics such as viewing angles, response times, brightness, driving voltage, and response speed, and can produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Meanwhile, luminescent compounds may be used to monitor, sense, or detect a biological material such as a protein of a cell. Examples of such luminescent compounds include a phosphorescent luminescent compound.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, an organometallic compound is represented by Formula 1:

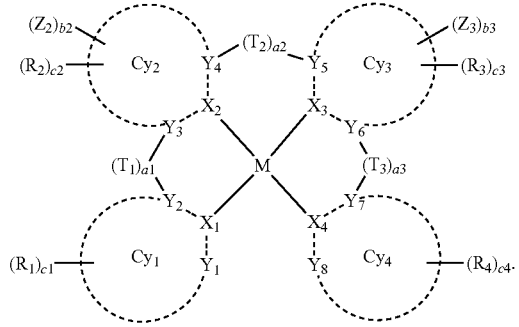

Formula 1

In Formula 1,

M may be platinum (Pt) or palladium (Pd), $X_1$ to $X_4$ may each independently be a carbon atom (C) or a nitrogen atom (N), at least one selected from $X_2$ and $X_3$ is C, and two bonds selected from a bond between $X_1$ and M, a bond between $X_2$ and M, a bond between $X_3$ and M, and a bond between $X_4$ and M are covalent bonds, and the remaining two bonds are coordinate bonds, $Y_1$ and $Y_8$ may each independently be C, N, an oxygen atom (O), or a sulfur atom (S), $Y_2$ to $Y_7$ may each independently be C or N, a bond between $X_1$ and $Y_1$, a bond between $X_1$ and $Y_2$, a bond between $X_2$ and $Y_3$, a bond between $X_2$ and $Y_4$, a bond between $X_3$ and $Y_5$, a bond between $X_3$ and $Y_6$, a bond between $X_4$ and $Y_7$, and a bond between $X_4$ and $Y_8$ may each independently be a single bond or a double bond, $Cy_1$ to $Cy_4$ may each independently be selected from a $C_5$-$C_{30}$ carbocyclic group and a $C_1$-$C_{30}$ heterocyclic group, $T_1$ to $T_3$ may each independently be selected from *—O—*', *—S—*', *—C($R_5$)($R_6$)—*', *—C($R_5$)=*', *=C($R_5$)—*', *—C($R_5$)=C($R_6$)—*', *—C≡C—*', *—N($R_5$)—*', *—Si($R_5$)($R_6$)—*', and *—P($R_5$)($R_6$)—*', $R_5$ and $R_6$ may optionally be linked via a first linking group to form a substituted or unsubstituted $C_5$-$C_{30}$ carbocyclic group or a substituted or unsubstituted $C_1$-$C_{30}$ heterocyclic group, a1 to a3 may each independently be 0, 1, 2, or 3, wherein, when a1 is 0, *-$(T_1)_{a1}$-*' may be a single bond, when a2 is 0, *-$(T_2)_{a2}$-*' may be a single bond, and when a3 is 0, *-$(T_3)_{a3}$-*' may be a single bond, $Z_2$ and $Z_3$ may each independently be selected from —F, —Cl, —Br, —I, —C(=O)($Q_1$), —CFH$_2$, —CF$_2$H, —CF$_3$, a cyano group, —S(=O)$_2$($Q_1$), —N$^+$($Q_1$)($Q_2$)($Q_3$), a nitro group, and a substituted or unsubstituted π electron-depleted nitrogen-containing ring group, b2 and b3 may each independently be 0, 1, 2, or 3, and the sum of b2 and b3 may be 1 or more, wherein, when $X_2$ is 0 and $X_3$ is N, b2 may not be 0, and when $X_2$ is N and $X_3$ is C, b3 may not be 0, $R_1$ to $R_6$ may each independently be selected from hydrogen, deuterium, —F, —Cl, —Br, —I, —SF$_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group(aryloxy), a substituted or unsubstituted $C_6$-$C_{60}$ arylthio group(arylthio), a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_4$)($Q_5$)($Q_6$), —N($Q_4$)($Q_5$), —B($Q_4$)($Q_5$), —C(=O)($Q_4$), —S(=O)$_2$($Q_4$), and —P(=O)($Q_4$)($Q_5$), c1 to c4 may each independently be 0, 1, 2, 3, 4, or 5, when c1 is two or more, two of groups $R_1$ in the number of c1 may optionally be linked to form a substituted or unsubstituted $C_5$-$C_{30}$ carbocyclic group or a substituted or unsubstituted $C_1$-$C_{30}$ heterocyclic group, when c2 is two or more, two of groups $R_2$ in the number of c2 may optionally be linked to form a substituted or unsubstituted $C_5$-$C_{30}$ carbocyclic group or a substituted or unsubstituted $C_1$-$C_{30}$ heterocyclic group, when c3 is two or more, two of groups $R_3$ in the number of c3 may optionally be linked to form a substituted or unsubstituted $C_5$-$C_{30}$ carbocyclic group or a substituted or unsubstituted $C_1$-$C_{30}$ heterocyclic group, when c4 is two or more, two of groups $R_4$ in the number of c4 may optionally be linked to form a substituted or unsubstituted $C_5$-$C_{30}$ carbocyclic group or a substituted or unsubstituted $C_1$-$C_{30}$ heterocyclic group, two or more neighboring substituents selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group, at least one substituent of the substituted π electron-depleted nitrogen-containing ring, substituted $C_5$-$C_{30}$ carbocyclic group, substituted $C_1$-$C_{30}$ heterocyclic group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_6$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$) and —P(=O)($Q_{21}$)($Q_{22}$); and Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_6$, $Q_{11}$ to $Q_{13}$, $Q_{21}$ to $Q_{23}$ and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and and *' may each independently be a binding site to a neighboring atom.

According to another aspect of an exemplary embodiment, an organic light-emitting device includes:
a first electrode,
a second electrode, and
an organic layer disposed between the first electrode and the second electrode,
wherein the organic layer including an emission layer and at least one organometallic compound described above.

An organometallic compound included in the emission layer may act as a dopant.

According to another aspect of an exemplary embodiment, a diagnostic composition includes at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment is represented by Formula 1:

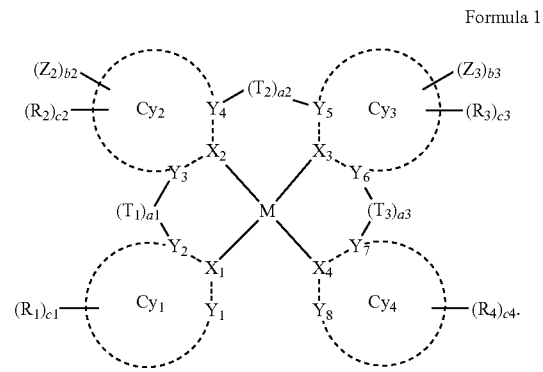

Formula 1

M in Formula 1 may be platinum (Pt) or palladium (Pd). In an embodiment, M in Formula 1 may be Pt, but embodiments of the present disclosure are not limited thereto.

The organometallic compound represented by Formula 1 may not consist of a pair of a cation and an anion, but may be neutral.

$X_1$ to $X_4$ in Formula 1 may each independently be a carbon atom (C) or a nitrogen atom (N), at least one selected from $X_2$ and $X_3$ may be C, and two bonds selected from a bond between $X_1$ and M, a bond between $X_2$ and M, a bond between $X_3$ and M, and a bond between $X_4$ and M may each be a covalent bond, and the remaining two bonds may each be a coordinate bond.

For example, in Formula 1, $X_1$ and $X_4$ may each be N, $X_2$ and $X_3$ may each be C, a bond between $X_1$ and M and a bond between $X_4$ and M may each be a coordinate bond, and a bond between $X_2$ and M and a bond between $X_3$ and M may each be a covalent bond.

In an embodiment, $X_1$ and $X_2$ may each be C, $X_3$ and $X_4$ may each be N, a bond between $X_1$ and M and a bond between $X_2$ and M may each be a covalent bond, and a bond between $X_3$ and M and a bond between $X_4$ and M may each be a coordinate bond.

In an embodiment, $X_1$ and $X_2$ may each be N, $X_3$ and $X_4$ may each be C, a bond between $X_1$ and M and a bond between $X_2$ and M may each be a coordinate bond, and a bond between $X_3$ and M and a bond between $X_4$ and M may each be a covalent bond, but embodiments of the present disclosure are not limited thereto.

In Formula 1, $Y_1$ and $Y_8$ may each independently be C, N, an oxygen atom (O), or a sulfur atom (S); $Y_2$ to $Y_7$ may each independently be C or N; and a bond between $X_1$ and $Y_1$, a bond between $X_1$ and $Y_2$, a bond between $X_2$ and $Y_3$, a bond between $X_2$ and $Y_4$, a bond between $X_3$ and $Y_5$, a bond between $X_3$ and $Y_6$, a bond between $X_4$ and $Y_7$, and a bond between $X_4$ and $Y_8$ may each independently be a single bond or a double bond.

For example, $Y_1$ and $Y_8$ in Formula 1 may each be C, but embodiments of the present disclosure are not limited thereto.

In an embodiment, in Formula 1, $X_1$ and $X_4$ may each be N, $X_2$ and $X_3$ may each be C, a bond between $X_1$ and M and a bond between $X_4$ and M may each be a coordinate bond, a bond between $X_2$ and M and a bond between $X_3$ and M may each be a covalent bond, and $Y_1$ to $Y_8$ may each be C.

In one or more embodiments, $X_1$ and $X_2$ may each be C, $X_3$ and $X_4$ may each be N, a bond between $X_1$ and M and a bond between $X_2$ and M may each be a covalent bond, a bond between $X_3$ and M and a bond between $X_4$ and M may each be a coordinate bond, and $Y_1$ to $Y_8$ may each be C.

In one or more embodiments, $X_1$ and $X_2$ may each be N, $X_3$ and $X_4$ may each be C, a bond between $X_1$ and M and a bond between $X_2$ and M may each be a coordinate bond, a bond between $X_3$ and M and a bond between $X_4$ and M may each be a covalent bond, and $Y_1$ to $Y_8$ may each be C, but embodiments of the present disclosure are not limited thereto.

$Cy_1$ to $Cy_4$ in Formula 1 may each independently be selected from a $C_5$-$C_{30}$ carbocyclic group and a $C_1$-$C_{30}$ heterocyclic group.

For example, in Formula 1, $Cy_1$ to $Cy_4$ may each independently be selected from a benzene group, a naphthalene group, an anthracene group, a phenanthrene group, a triphenylene group, a pyrene group, a chrysene group, a cyclopentadiene group, an indene group, a fluorene group, a pyrrole group, an indole group, a carbazole group, a furan group, a benzofuran group, a dibenzofuran group, a thiophene group, a benzothiophene group, a dibenzothiophene group, a 1,2,3,4-tetrahydronaphthalene group, a pyridine group, a pyrimidine group, a pyrazine group, a pyridazine group, a triazine group, a quinoline group, an isoquinoline group, a quinoxaline group, a quinazoline group, phenanthroline group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, and a benzofuropyridine group, and at least one selected from $Cy_2$ and $Cy_3$ may be selected from a benzene group, a naphthalene group, an anthracene group, a phenanthrene group, a triphenylene group, a pyrene group, a chrysene group, a cyclopentadiene group, an indene group, a fluorene group, a pyrrole group, an indole group, a carbazole group, a furan group, a benzofuran group, a dibenzofuran group, a thiophene group, a benzothiophene group, a dibenzothiophene group, and a 1,2,3,4-tetrahydronaphthalene group.

In an embodiment, in Formula 1, $Cy_1$ to $Cy_4$ may each independently be a benzene group, a naphthalene group, a fluorene group, a dibenzofuran group, a dibenzothiophene group, a 1,2,3,4-tetrahydronaphthalene group, a pyridine group, a pyrimidine group, a quinoline group, an isoquinoline group, a quinoxaline group, a quinazoline group, a 5,6,7,8-tetrahydroisoquinoline group, a 5,6,7,8-tetrahydroquinoline group, and a benzofuropyridine group, and at least one selected from $Cy_2$ and $Cy_3$ may be selected from a benzene group, a naphthalene group, a fluorene group, a dibenzofuran group, a dibenzothiophene group, and a 1,2,3,4-tetrahydronaphthalene group.

In an embodiment, in Formula 1, $Cy_1$ to $Cy_4$ may each independently be a benzene group, a pyridine group, and a benzofuropyridine group, and at least one selected from $Cy_2$ and $Cy_3$ may be a benzene group, but embodiments of the present disclosure are not limited thereto.

$T_1$ to $T_3$ in Formula 1 may each independently be selected from *—O—*', *—S—*', *—C($R_5$)($R_6$)—', *—C($R_5$)=*', *=C($R_5$)—*', *—C($R_5$)=C($R_6$)—*', *—C≡C—*', *—N($R_5$)—*', *—Si($R_5$)($R_6$)—*', and *—P($R_5$)($R_6$)—*'. $R_5$ and $R_6$ are the same as described below. * and *' may each indicate a binding site to a neighboring atom.

$R_5$ and $R_6$ may optionally be linked via a first linking group to form a substituted or unsubstituted $C_5$-$C_{30}$ carbocyclic group or a substituted or unsubstituted $C_1$-$C_{30}$ heterocyclic group.

The first linking group may be selected from a single bond, *—O—*', *—S—*', *—C($R_9$)($R_{10}$)—*', *—C($R_9$)=*', *=C($R_9$)—*', *—C($R_9$)=C($R_{10}$)—*', *—C≡C—*', *—N($R_9$)—*', *—Si($R_9$)($R_{10}$)—*', and *—P($R_9$)($R_{10}$)—*', $R_9$ and $R_{19}$ are each the same as described in connection with $R_5$, and * and *' may each independently be a binding site to a neighboring atom.

In an embodiment, $T_1$ to $T_3$ in Formula 1 may each independently be selected from *—O—*', *—S—*', *—C($R_5$)($R_6$)—*', *—N($R_5$)—*', *—Si($R_5$)($R_6$)—*', and *—P($R_5$)($R_6$)—*'.

In one or more embodiments, $T_1$ to $T_3$ in Formula 1 may each be *—N($R_5$)—*', but embodiments of the present disclosure are not limited thereto.

a1 to a3 in Formula 1 may indicate the numbers of $T_1$ to $T_3$, respectively, and may each independently be 0, 1, 2, or 3. When a1 is 0, *-$(T_1)_{a1}$-*' may be a single bond; when a1 is two or more, two or more groups $T_1$ may be identical to or different from each other; when a2 is 0, *-$(T_2)_{a2}$-*' may be a single bond; when a2 is two or more, two or more groups $T_2$ may be identical to or different from each other; when a3 is 0, *-$(T_3)_{a3}$-*' may be a single bond; and when a3 is two or more, two or more groups $T_3$ may be identical to or different from each other.

For example, a1 to a3 may each independently be 0 or 1.

The sum of a1, a2, and a3 in Formula 1 may be 0, or 1 or more.

In one or more embodiments, in Formula 1, a1, a2, and a3 may each be 0;

a1 may be 1, and a2 and a3 may each be 0;

a2 may be 1, and a1 and a3 may each be 0;

a3 may be 1, and a1 and a2 may each be 0, but embodiments of the present disclosure are not limited thereto.

In Formula 1, when each of a1 and a3 is 0, a2 is 1, and $T_2$ is *—N($R_5$)—*', $R_5$ may not be a substituted or unsubstituted phenyl group.

For example, in Formula 1, when each of a1 and a3 is 0, a2 is 1, and $T_2$ is *—N($R_5$)—*', $R_5$ may be selected from hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_7$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_4$)($Q_5$)($Q_6$), —N($Q_4$)($Q_5$), —B($Q_4$)($Q_5$), —C(=O)($Q_4$), —S(=O)$_2$ ($Q_4$), and —P(=O)($Q_4$)($Q_5$), $Q_4$ to $Q_6$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In an embodiment, in Formula 1, when each of a1 and a3 is 0, a2 is 1, and $T_2$ is*—N($R_5$)—*', $R_5$ may be selected from:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group, substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a naphthyl group, a pyridinyl group, and a pyrimidinyl group, a $C_1$-$C_{20}$ alkoxy group, substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group; and N(Q$_4$)(Q$_5$), —Si(Q$_4$)(Q$_5$)(Q$_6$), —B(Q$_4$)(Q$_5$) and —P(=O)(Q$_4$)(Q$_5$), wherein Q$_4$ to Q$_6$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

In an embodiment, in Formula 1, when each of a1 and a3 is 0, a2 is 1, and T$_2$ is*—N(R$_5$)—*', R$_5$ may be selected from:

a naphthyl group, an anthracenyl group, a phenanthrenyl group, a naphthacenyl group, a benzoanthracenyl, a triphenylenyl group, a pyrenyl group, a benzophenanthrenyl group, a chrysenyl group, a fluoranthenyl group, a picenyl group, a pentaphenyl group, a perylene group, a pyrrolyl group, a pyrazolyl group, an imidazolyl group, a thiazolyl group, an isothiazolyl group, an oxazolyl group, an isoxazolyl group, a triazole, an oxadiazole, a tetrazole, a pyridinyl group, a pyrazinyl group, a pyrimidinyl group, a pyridazinyl group, a triazinyl group, an isoindolyl group, an indolyl group, an indazolyl group, a benzimidazolyl group, a benzoxazolyl group, an isobenzoxazolyl group, a benzothiazolyl group, an isobenzothiazolyl group, an imidazopyridinyl group, an imidazopyrimidinyl group, a quinolinyl group, an isoquinolinyl group, a cinnolinyl group, a quinazolinyl group, a quinoxalinyl group, a naphthyridinyl group, a benzoquinolinyl group, an acridinyl group, a phenanthridinyl group, a phenanthrolinyl group, a phenazinyl group, a carbazolyl group, a benzocarbazolyl group, and a dibenzocarbazolyl group; and a naphthyl group, an anthracenyl group, a phenanthrenyl group, a naphthacenyl group, a benzoanthracenyl, a triphenylenyl group, a pyrenyl group, a benzophenanthrenyl group, a chrysenyl group, a fluoranthenyl group, a picenyl group, a pentaphenyl group, a perylene group, a pyrrolyl group, a pyrazolyl group, an imidazolyl group, a thiazolyl group, an isothiazolyl group, an oxazolyl group, an isoxazolyl group, a triazole, an oxadiazole, a tetrazole, a pyridinyl group, a pyrazinyl group, a pyrimidinyl group, a pyridazinyl group, a triazinyl group, an isoindolyl group, an indolyl group, an indazolyl group, a benzimidazolyl group, a benzoxazolyl group, an isobenzoxazolyl group, a benzothiazolyl group, an isobenzothiazolyl group, an imidazopyridinyl group, an imidazopyrimidinyl group, a quinolinyl group, an isoquinolinyl group, a cinnolinyl group, a quinazolinyl group, a quinoxalinyl group, a naphthyridinyl group, a benzoquinolinyl group, an acridinyl group, a phenanthridinyl group, a phenanthrolinyl group, a phenazinyl group, a carbazolyl group, a benzocarbazolyl group, and a dibenzocarbazolyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, an anthracenyl group, a phenanthrenyl group, a naphthacenyl group, a benzoanthracenyl, a triphenylenyl group, a pyrenyl group, a benzophenanthrenyl group, a chrysenyl group, a fluoranthenyl group, a picenyl group, a pentaphenyl group, a perylene group, a pyrrolyl group, a pyrazolyl group, an imidazolyl group, a thiazolyl group, an isothiazolyl group, an oxazolyl group, an isoxazolyl group, a triazole, an oxadiazole, a tetrazole, a pyridinyl group, a pyrazinyl group, a pyrimidinyl group, a pyridazinyl group, a triazinyl group, an isoindolyl group, an indolyl group, an indazolyl group, a benzimidazolyl group, a benzoxazolyl group, an isobenzoxazolyl group, a benzothiazolyl group, an isobenzothiazolyl group, an imidazopyridinyl group, an imidazopyrimidinyl group, a quinolinyl group, an isoquinolinyl group, a cinnolinyl group, a quinazolinyl group, a quinoxalinyl group, a naphthyridinyl group, a benzoquinolinyl group, an acridinyl group, a phenanthridinyl group, a phenanthrolinyl group, a phenazinyl group, a carbazolyl group, a benzocarbazolyl group, and a dibenzocarbazolyl group.

In an embodiment, in Formula 1, when each of a1 and a3 is 0, a2 is 1, and when $T_2$ is *—N($R_5$)—*', $R_5$ may be selected from:

a naphthyl group, an anthracenyl group, a phenanthrenyl group, a triphenylenyl group, a pyrenyl group, a chrysenyl group, a fluoranthenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a phenanthrolinyl group, and a triazinyl group; and a naphthyl group, an anthracenyl group, a phenanthrenyl group, a triphenylenyl group, a pyrenyl group, a chrysenyl group, a fluoranthenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a phenanthrolinyl group, and a triazinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, an anthracenyl group, a phenanthrenyl group, a triphenylenyl group, a pyrenyl group, a chrysenyl group, a fluoranthenyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a cinnolinyl group, a phenanthrolinyl group, and a triazinyl group;

but embodiments of the present disclosure are not limited thereto.

$Z_2$ and $Z_3$ in Formula 1 are electron withdrawing groups that withdraw electrons with respect to Cy2 and Cy3, respectively, and may each independently be selected from —F, —Cl, —Br, —I, —C(=O)($Q_1$), —$CFH_2$, —$CF_2H$, —$CF_3$, a cyano group, —S(=O)$_2$($Q_1$), —$N^+$($Q_1$)($Q_2$)($Q_3$), a nitro group, and a substituted or unsubstituted π electron-depleted nitrogen-containing ring group, wherein $Q_1$ to $Q_3$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The "π electron-depleted nitrogen-containing ring group" refers to a $C_1$-$C_{60}$ heterocyclic group having at least one *—N=*' moiety as a ring-forming moiety.

For example, the "π electron-depleted nitrogen-containing ring group" may be i) a 5-membered to 7-membered heteromonocyclic group having at least one *—N=*' moiety, ii) a heteropolycyclic group in which two or more selected from a 5-membered to 7-membered heteromonocyclic group having at least one *—N=*' moiety are condensed, or iii) a heteropolycyclic group in which at least one selected from 5-membered to 7-membered heteromonocyclic group having at least one *—N=*' moiety is condensed with at least one $C_5$-$C_{60}$ carbocyclic group.

In an embodiment, $Z_2$ and $Z_3$ in Formula 1 may each independently be selected from:

F, —Cl, —Br, —I, —C(=O)($Q_1$), —$CFH_2$, —$CF_2H$, —$CF_3$, a cyano group, —S(=O)$_2$($Q_1$), —$N^+$($Q_1$)($Q_2$)($Q_3$), and a nitro group;

an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indazolyl group, a purinyl group(purinyl), a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, and an azacarbazolyl group; and an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, and an azacarbazolyl group, each substituted with at least one selected from deuterium, —F, —Cl, —Br, —I, —C(=O)($Q_{31}$), —$CFH_2$, —$CF_2H$, —$CF_3$, a cyano group, —S(=O)$_2$($Q_{31}$), —$N^+$($Q_{31}$)($Q_{32}$)($Q_{33}$), a nitro group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spirobifluorenyl group, a phenanthrenyl group, an anthracenyl group, a fluoranthenyl group, a triphenylenyl group, a pyrenyl group, a chrysenyl group, a perylenyl group, a pentaphenyl group, hexacenyl group, a pentacenyl group, a thiophenyl group, a selenophenyl group, a furanyl group, a carbazolyl group, an indolyl group, an isoindolyl group, a benzofuranyl group, a benzothiophenyl group, a benzoselenophenyl group, a dibenzofuranyl group, a dibenzothiophenyl group, a dibenzoselenophenyl group, a benzocarbazolyl group, a dibenzocarbazolyl group, a dibenzosilolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, and an azacarbazolyl group, wherein $Q_1$ to $Q_3$ and $Q_{31}$ to $Q_{33}$ may each independently be selected from hydrogen, deuterium, —F, —Cl, —Br, —I, a hydroxyl group, a $C_1$-$C_{10}$ alkyl group, a $C_1$-$C_{10}$ alkoxy group, a phenyl group, and a naphthyl group.

In one or more embodiments, $Z_2$ and $Z_3$ in Formula 1 may each independently be selected from:

F, —Cl, —Br, —I, —C(=O)($Q_1$), —CFH$_2$, —CF$_2$H, —CF$_3$, a cyano group, —S(=O)$_2$($Q_1$), —N$^+$($Q_1$)($Q_2$)($Q_3$), and a nitro group, wherein $Q_1$ to $Q_3$ may each independently be hydrogen, deuterium, —F, —Cl, —Br, —I, a hydroxyl group, a $C_1$-$C_{10}$ alkyl group, a $C_1$-$C_{10}$ alkoxy group, a phenyl group, and a naphthyl group.

In one or more embodiments, $Z_2$ and $Z_3$ in Formula 1 may each independently be —F, —CF$_3$ or a cyano group, but embodiments of the present disclosure are not limited thereto.

b2 and b3 in Formula 1 indicate the number of $Z_2$ and the number of $Z_3$, respectively, and may each independently be 0, 1, 2, or 3, and the sum of b2 and b3 may be 1 or more. When b2 is two or more, two or more of groups $Z_2$ may be identical to or different from each other, and when b3 is two or more, two or more of groups $Z_3$ may be identical to or different from each other.

For example, b2 and b3 may each independently be 0 or 1.

In one or more embodiments, in Formula 1,
b2 is 1 and b3 is 0;
b2 is 0 and b3 is 1; or
b2 and b3 may each be 1, but embodiments of the present disclosure are not limited thereto.

In Formula 1, when $X_2$ is C and $X_3$ is N, b2 is not 0; and when $X_2$ is N and $X_3$ is C, b3 is not 0.

For example, in Formula 1,
when $X_2$ is C and $X_3$ is N, b2 may be 1, 2, or 3 and b3 may be 0, 1, 2, or 3;
when $X_2$ is N and $X_3$ is C, b2 may be 0, 1, 2, or 3 and b3 may be 1, 2, or 3; or
when each of $X_2$ and $X_3$ is C, b2 and b3 may each independently be 0, 1, 2, or 3, and the sum of b2 and b3 may be 1 or more.

$R_1$ to $R_6$ in Formula 1 may each independently be selected from hydrogen, deuterium, —F, —Cl, —Br, —I, —SF$_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_4$)($Q_5$)($Q_6$), —N($Q_4$)($Q_5$), —B($Q_4$)($Q_5$), —C(=O)($Q_4$), —S(=O)$_2$($Q_4$), and —P(=O)($Q_4$)($Q_5$), wherein $Q_4$ to $Q_6$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In an embodiment, $R_1$ to $R_6$ in Formula 1 may each independently be selected from:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a selenophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoselenophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a benzocarbazolyl group, a dibenzocarbazolyl group, an imidazopyridinyl group, and an imidazopyrimidinyl group; and $N(Q_4)(Q_5)$, —$Si(Q_4)(Q_5)(Q_6)$, —$B(Q_4)(Q_5)$, and —$P(=O)(Q_4)(Q_5)$, wherein $Q_4$ to $Q_6$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, $R_1$ to $R_6$ in Formula 1 may each independently be selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a phenanthrenyl group, a pyridinyl group, a pyrimidinyl group, a carbazolyl group, a furanyl group, a thiophenyl group, a selenophenyl group, a benzofuranyl group, a benzothiophenyl group, a benzoselenophenyl group, a dibenzofuranyl group, a dibenzothiophenyl group, and a dibenzoselenophenyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a phenanthrenyl group, a pyridinyl group, a pyrimidinyl group, a carbazolyl group, a furanyl group, a thiophenyl group, a selenophenyl group, a benzofuranyl group, a benzothiophenyl group, a benzoselenophenyl group, a dibenzofuranyl group, a dibenzothiophenyl group, and a dibenzoselenophenyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a phenanthrenyl group, a pyridinyl group, a pyrimidinyl group, a carbazolyl group, a furanyl group, a thiophenyl group, a selenophenyl group, a benzofuranyl group, a benzothiophenyl group, a benzoselenophenyl group, a dibenzofuranyl group, a dibenzothiophenyl group, and a dibenzoselenophenyl group; and $N(Q_4)(Q_5)$, —$Si(Q_4)(Q_5)(Q_6)$, —$B(Q_4)(Q_5)$, and —$P(=O)(Q_4)(Q_5)$, wherein $Q_4$ to $Q_6$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

c1 to c4 in Formula 1 indicate the numbers of $R_1$ to $R_4$, respectively, and may each independently be 0, 1, 2, 3, 4, or 5. When c1 is two or more, two or more of groups $R_1$ may be identical to or different from each other; when c2 is two or more, two or more of groups $R_2$ may be identical to or different from each other; when c3 is two or more, two or more of groups $R_3$ may be identical to or different from each other; and when c4 is two or more, two or more of groups $R_4$ may be identical to or different from each other, but embodiments of the present disclosure are not limited thereto.

In Formula 1, two of groups $R_1$ in the number of c1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of c2 may optionally be linked to form a substituted or unsubstituted $C_5$-$C_{30}$ carbocyclic group or a substituted or unsubstituted $C_1$-$C_{30}$ heterocyclic group, two of groups $R_3$ in the number of c3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of c4 may optionally be linked to form a substituted or unsubstituted $C_5$-$C_{30}$ carbocyclic group or a substituted or unsubstituted $C_1$-$C_{30}$ heterocyclic group, and two neighboring substituents selected from $R_1$ to $R_4$ may optionally be linked to form a substituted or unsubstituted $C_5$-$C_{30}$ carbocyclic group or a substituted or unsubstituted $C_1$-$C_{30}$ heterocyclic group.

For example, a substituted or unsubstituted $C_5$-$C_{30}$ carbocyclic group or a substituted or unsubstituted $C_1$-$C_{30}$ heterocyclic group, which may be formed by optionally forming a bond between i) two of groups $R_1$ in the number of c1, ii) two of groups $R_2$ in the number of c2, iii) two of groups $R_3$ in the number of c3, iv) two of groups $R_4$ in the number of c4, and v) two or more neighboring substituents selected from $R_1$ to $R_4$, in Formula 1, may be selected from:

a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzofuran group, a benzothiophene group, a benzoselenophenegroup, an indole group, an indene group, a benzosilole group, an azabenzofuran group, an azabenzothiophene group, azabenzoselenophenegroup, an azaindole group, an azaindene group, and an azabenzosilole group; and a pentadiene group, a cyclohexane group, a cycloheptane group, an adamantane group, a bicyclo-heptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzofuran group, a benzothiophene group, a benzoselenophenegroup, an indole group, an indene group, a benzosilole group, an azabenzofuran group, an azabenzothiophene group, azabenzoselenophenegroup, an azaindole group, an azaindene group, and an azabenzosilole group, each substituted with at least one $R_{1a}$, but embodiments of the present disclosure are not limited thereto.

$R_{1a}$ is the same as described in connection with $R_1$.

In an embodiment, a moiety represented by

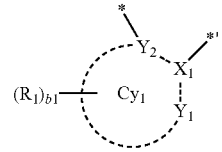

in Formula 1 may be a group represented by one of Formulae Cy1-1 to Cy1-16:

Formula Cy1-1

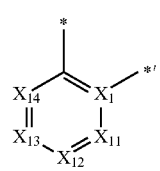

-continued
Formula Cy1-2
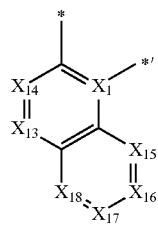
Formula Cy1-3
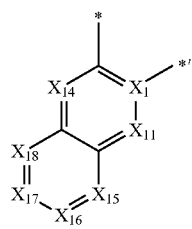
Formula Cy1-4
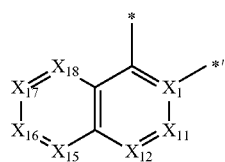
Formula Cy1-5
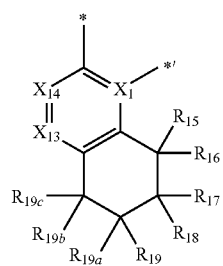
Formula Cy1-6
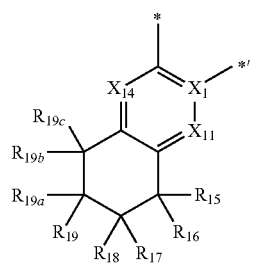
Formula Cy1-7
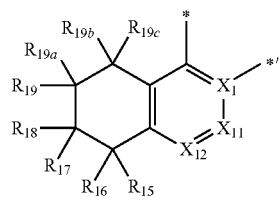
-continued
Formula Cy1-8
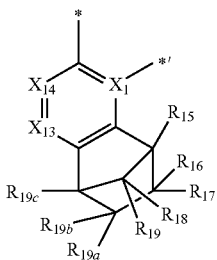
Formula Cy1-9
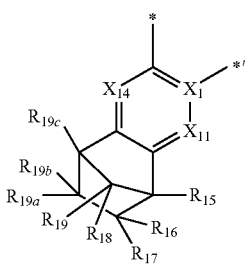
Formula Cy1-10
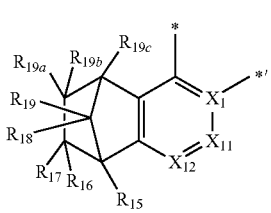
Formula Cy1-11
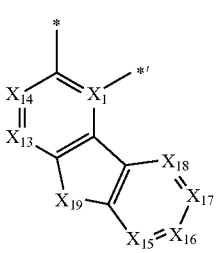
Formula Cy1-12
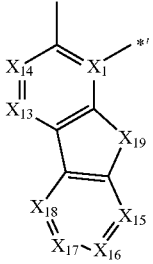
Formula Cy1-13
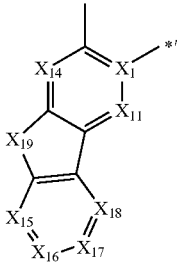

Formula Cy1-14

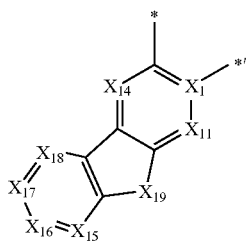

Formula Cy1-15

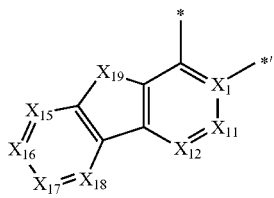

Formula Cy1-16

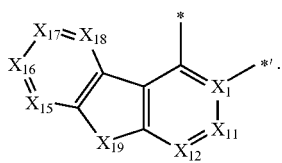

In Formulae Cy1-1 to Cy1-16, $X_1$ may be N or C, $X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{17}$ may be N or $C(R_{17})$, $X_{18}$ may be N or $C(R_{18})$, $X_{19}$ may be $C(R_{19a})(R_{19b})$, $N(R_{19})$, O, S, or $Si(R_{19a})(R_{19b})$, $R_{11}$ to $R_{19}$ and $R_{19a}$ to $R_{19c}$ may each independently be the same as described in connection with $R_1$, and each of * and *' indicates a binding site to a neighboring atom.

For example, in Formulae Cy1-1 to Cy1-16, $X_{11}$ may be $C(R_{11})$, $X_{12}$ may be $C(R_{12})$, $X_{13}$ may be $C(R_{13})$, $X_{14}$ may be $C(R_{14})$, $X_{15}$ may be $C(R_{15})$, $X_{16}$ may be $C(R_{16})$, $X_{17}$ may be $C(R_{17})$, $X_{18}$ may be $C(R_{18})$, and $X_{19}$ may be O, but embodiments of the present disclosure are not limited thereto.

In an embodiment, a moiety represented by

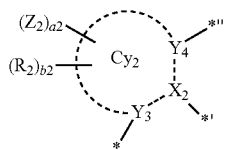

in Formula 1 may be a group represented by one of Formulae Cy2-1 to Cy2-11:

Formula Cy2-1

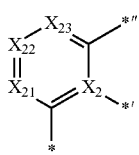

Formula Cy2-2

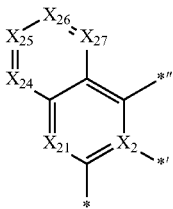

Formula Cy2-3

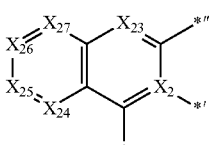

Formula Cy2-4

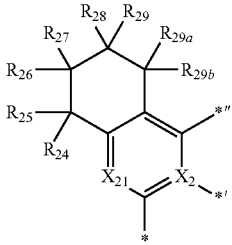

Formula Cy2-5

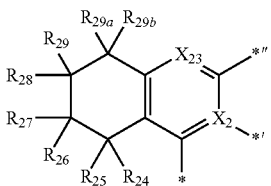

Formula Cy2-6

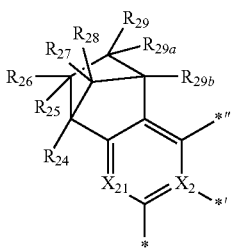

Formula Cy2-7

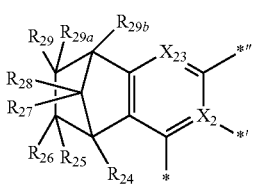

Formula Cy2-8

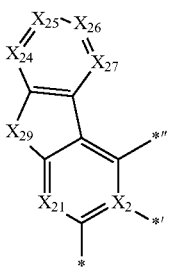

-continued

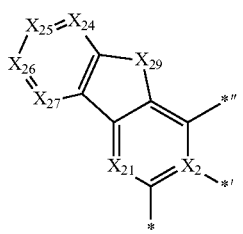
Formula Cy2-9

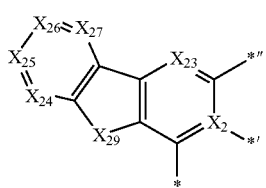
Formula Cy2-10

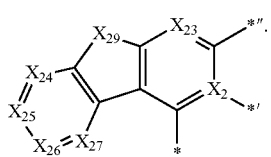
Formula Cy2-11

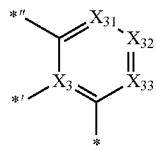
Formula Cy3-1

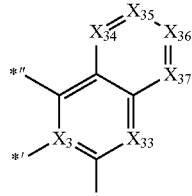
Formula Cy3-2

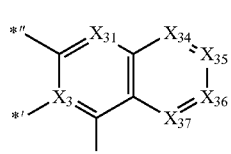
Formula Cy3-3

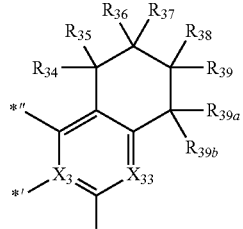
Formula Cy3-4

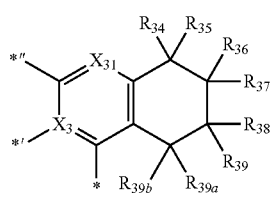
Formula Cy3-5

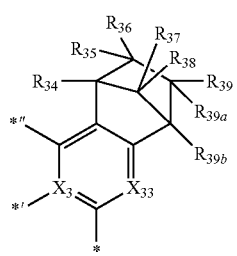
Formula Cy3-6

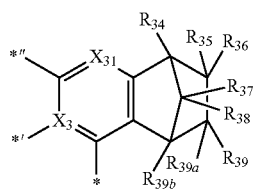
Formula Cy3-7

In Formulae Cy2-1 to Cy2-11, $X_2$ may be N or C, $X_{21}$ may be N, $C(R_{21})$, or $C(Z_{21})$; $X_{22}$ may be N, $C(R_{22})$, or $C(Z_{22})$; $X_{23}$ may be N, $C(R_{23})$, or $C(Z_{23})$; $X_{24}$ may be N, $C(R_{24})$, or $C(Z_{24})$; $X_{25}$ may be N, $C(R_{26})$, or $C(Z_{25})$; $X_{26}$ may be N, $C(R_{26})$, or $C(Z_{26})$; $X_{27}$ may be N, $C(R_{27})$, or $C(Z_{27})$, $X_{29}$ may be $C(R_{29a})(R_{29b})$, $N(R_{29})$, O, S, or $Si(R_{29a})(R_{29b})$, $R_{21}$ to $R_{27}$, $R_{29}$, $R_{29a}$, and $R_{29b}$ may each independently be the same as described in connection with $R_2$, $Z_{21}$ to $Z_{27}$ may each independently be the same as described in connection with $Z_2$, and

*, *', and *" may each independently be a binding site to a neighboring atom.

For example, in Formulae Cy2-1 to Cy2-11, $X_{21}$ may be $C(R_{21})$, $X_{22}$ may be $C(R_{22})$, $X_{23}$ may be $C(R_{23})$, $X_{24}$ may be $C(R_{24})$, $X_{25}$ may be $C(R_{25})$, $X_{26}$ may be $C(R_{26})$, $X_{27}$ may be $C(R_{27})$, and $X_{29}$ may be O.

In an embodiment, in Formulae Cy2-1 to Cy2-11, $X_{21}$ may be $C(R_{21})$, $X_{22}$ may be $C(Z_{22})$, $X_{23}$ may be $C(R_{23})$, $X_{24}$ may be $C(R_{24})$, $X_{25}$ may be $C(R_{25})$, $X_{26}$ may be $C(R_{26})$, $X_{27}$ may be $C(R_{27})$, and $X_{29}$ may be O, but embodiments of the present disclosure are not limited thereto.

In an embodiment, a moiety represented by

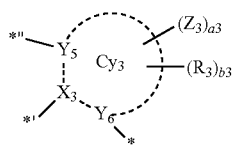

in Formula 1 may be a group represented by one of Formulae Cy3-1 to Cy3-11:

-continued

Formula Cy3-8
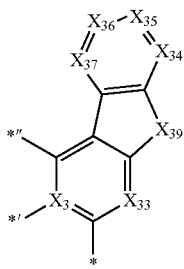

Formula Cy3-9
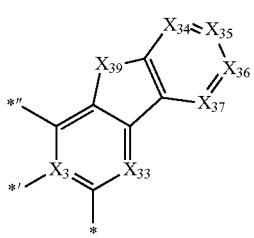

Formula Cy3-10
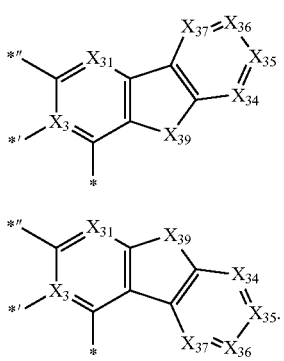

Formula Cy3-11

In Formulae Cy3-1 to Cy3-11, $X_3$ may be N or C, $X_{31}$ may be N, $C(R_{31})$, or $C(Z_{31})$, $X_{32}$ may be N, $C(R_{32})$, or $C(Z_{32})$, $X_{33}$ may be N, $C(R_{33})$, or $C(Z_{33})$, $X_{34}$ may be N, $C(R_{34})$, or $C(Z_{34})$, $X_{35}$ may be N, $C(R_{35})$, or $C(Z_{35})$, $X_{36}$ may be N, $C(R_{36})$, or $C(Z_{36})$, $X_{37}$ may be N, $C(R_{37})$, or $C(Z_{37})$, $X_{39}$ may be $C(R_{39a})(R_{39b})$, $N(R_{39})$, O, S, or $Si(R_{39a})(R_{39b})$, $R_{31}$ to $R_{37}$, $R_{39}$, $R_{39a}$, and $R_{39b}$ may each independently be the same as described in connection with $R_3$, $Z_{31}$ to $Z_{37}$ may each independently be the same as described in connection with $Z_3$, and , *', and *" may each independently be a binding site to a neighboring atom.

For example, in Formulae Cy3-1 to Cy3-11, $X_{31}$ may be $C(R_{31})$, $X_{32}$ may be $C(R_{32})$, $X_{33}$ may be $C(R_{33})$, $X_{34}$ may be $C(R_{34})$, $X_{35}$ may be $C(R_{35})$, $X_{36}$ may be $C(R_{36})$, $X_{37}$ may be $C(R_{37})$, and $X_{39}$ may be O.

In an embodiment, in Formulae Cy3-1 to Cy3-11, $X_{31}$ may be $C(R_{31})$, $X_{32}$ may be $C(Z_{32})$, $X_{33}$ may be $C(R_{33})$, $X_{34}$ may be $C(R_{34})$, $X_{35}$ may be $C(R_{35})$, $X_{36}$ may be $C(R_{36})$, $X_{37}$ may be $C(R_{37})$, and $X_{39}$ may be O, but embodiments of the present disclosure are not limited thereto.

In an embodiment, a moiety represented by

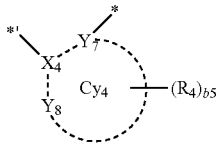

in Formula 1 may be a group represented by one of Formulae Cy4-1 to Cy4-16:

Formula Cy4-1
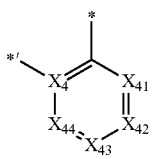

Formula Cy4-2
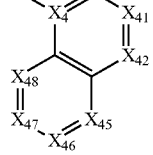

Formula Cy4-3
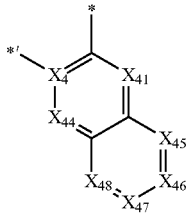

Formula Cy4-4
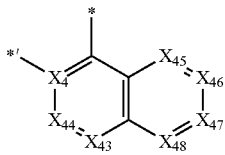

Formula Cy4-5
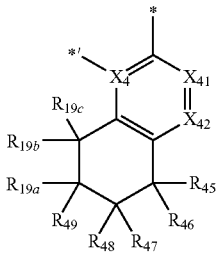

Formula Cy4-6
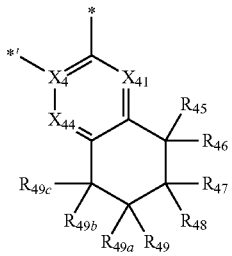

-continued

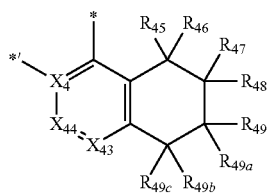
Formula Cy4-7

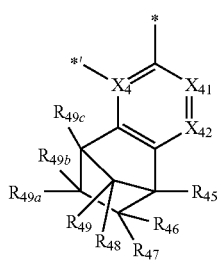
Formula Cy4-8

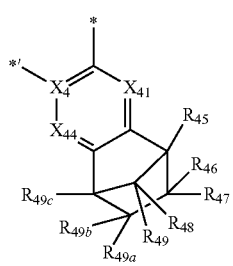
Formula Cy4-9

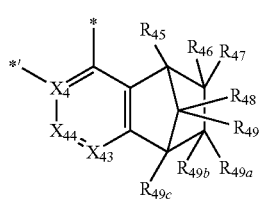
Formula Cy4-10

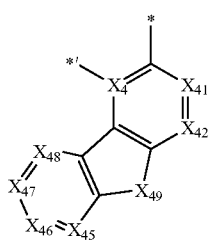
Formula Cy4-11

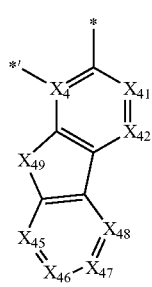
Formula Cy4-12

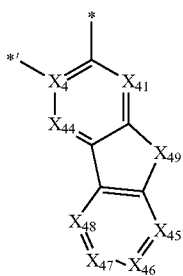
Formula Cy4-13

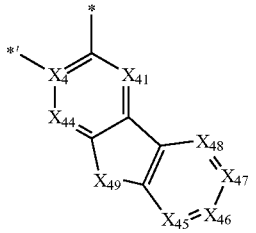
Formula Cy4-14

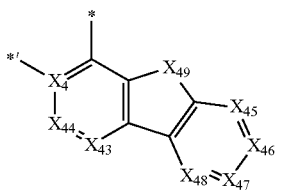
Formula Cy4-15

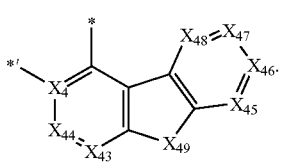
Formula Cy4-16

In Formulae Cy4-1 to Cy4-16, $X_4$ may be N or C, $X_{41}$ may be N or $C(R_{41})$, $X_{42}$ may be N or $C(R_{42})$, $X_{43}$ may be N or $C(R_{43})$, $X_{44}$ may be N or $C(R_{44})$, $X_{45}$ may be N or $C(R_{45})$, $X_{46}$ may be N or $C(R_{46})$, $X_{47}$ may be N or $C(R_{47})$, $X_{48}$ may be N or $C(R_{48})$, $X_{49}$ may be $C(R_{49a})(R_{49b})$, $N(R_{49})$, O, S, or $Si(R_{46a})(R_{49b})$, $R_{41}$ to $R_{49}$ and $R_{49a}$ to $R_{46c}$ may each independently be the same as described in connection with $R_4$, and each of * and *' indicates a binding site to a neighboring atom.

For example, in Formulae Cy4-1 to Cy4-16, $X_{41}$ may be $C(R_{41})$, $X_{42}$ may be $C(R_{42})$, $X_{43}$ may be $C(R_{43})$, $X_{44}$ may be $C(R_{44})$, $X_{45}$ may be $C(R_{45})$, $X_{46}$ may be $C(R_{46})$, $X_{47}$ may be $C(R_{47})$, $X_{48}$ may be $C(R_{48})$, and $X_{49}$ may be O, but embodiments of the present disclosure are not limited thereto.

In an embodiment, in Formula 1, the moiety represented by

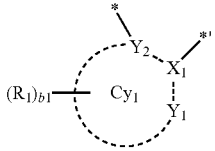

may be a group represented by one of Formulae Cy1-1, Cy1-14, and Cy1-15, the moiety represented by

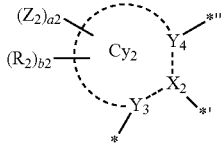

may be a group represented by Formula Cy2-1, the moiety represented by

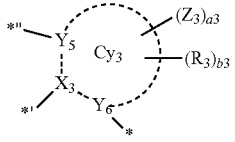

may be a group represented by Formula Cy3-1, and the moiety represented by

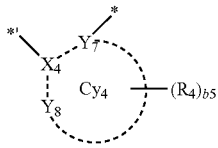

may be a group represented by one of Formulae Cy4-1, Cy4-14, and Cy4-15. In this regard, $X_1$ is N, $X_2$ is C, $X_3$ is C, and $X_4$ is N; $X_1$ is C, $X_2$ is C, $X_3$ is N, and $X_4$ is N; or $X_1$ is N, $X_2$ is N, $X_3$ is C, and $X_4$ is C, but embodiments of the present disclosure are not limited thereto.

In an embodiment, the moiety represented by

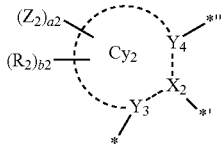

in Formula 1 may be a group represented by one of Formulae Cy2-1(1) to Cy2-1(7), and/or the moiety represented by

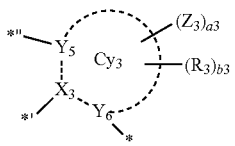

in Formula 1 may be a group represented by one of Formulae Cy3-1(1) to Cy3-1(7):

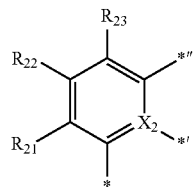
Formula Cy2-1(1)

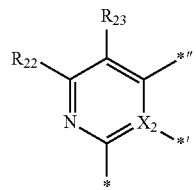
Formula Cy2-1(2)

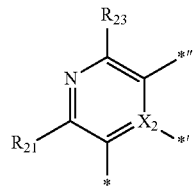
Formula Cy2-1(3)

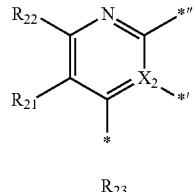
Formula Cy2-1(4)

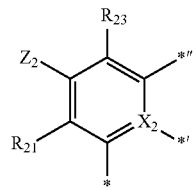
Formula Cy2-1(5)

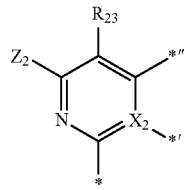
Formula Cy2-1(6)

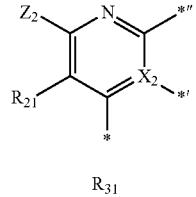
Formula Cy2-1(7)

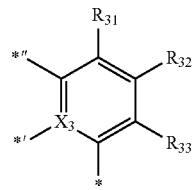
Formula Cy3-1(1)

-continued

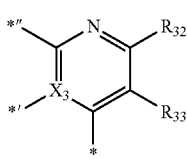
Formula Cy3-1(2)

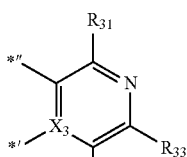
Formula Cy3-1(3)

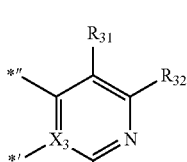
Formula Cy3-1(4)

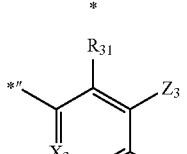
Formula Cy3-1(5)

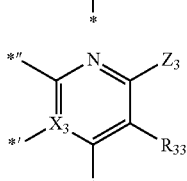
Formula Cy3-1(6)

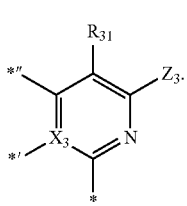
Formula Cy3-1(7)

In Formulae Cy2-1(1) to Cy2-1(7) and Cy3-1(1) to Cy3-1(7),
- $X_2$, $X_3$, $Z_2$, and $Z_3$ are the same as described above,
- $R_{21}$ to $R_{23}$ may each independently be the same as described in connection with $R_2$,
- $R_{31}$ to $R_{33}$ may each independently be the same as described in connection with $R_3$, and
- , *', and *'' may each independently be a binding site to a neighboring atom.

For example, in Formula 1, the moiety represented by

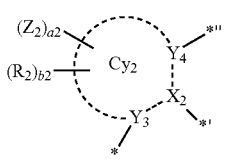

may be a group represented by one of Formulae Cy2-1(1) to Cy2-1(4), $X_2$ may be C or N; the moiety represented by

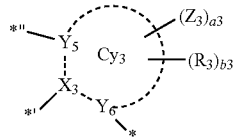

may be a group represented by one of Formulae Cy3-1(5) to Cy3-1(7), and $X_3$ may be C.

In an embodiment, in Formula 1, the moiety represented by

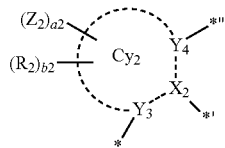

may be a group represented by one of Formulae Cy2-1(5) to Cy2-1(7), $X_2$ may be C, the moiety represented by

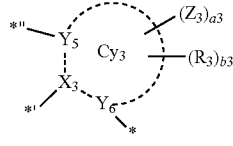

may be a group represented by one of Formulae Cy3-1(1) to Cy3-1(4), and $X_3$ may be C or N.

In an embodiment, in Formula 1, the moiety represented by

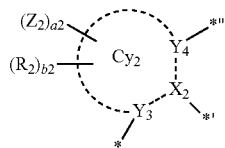

may be a group represented by one of Formulae Cy2-1(5) to Cy2-1(7), the moiety represented by

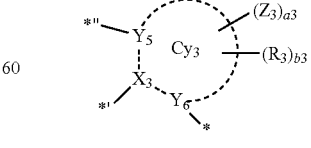

may be a group represented by one of Formulae Cy3-1(5) to Cy3-1(7), and $X_2$ and $X_3$ may each independently be C or N, wherein at least one selected from $X_2$ and $X_3$ may be C.

In an embodiment, in Formula 1, the moiety represented by

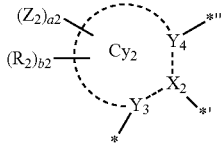

may be a group represented by Formula Cy2-1(1), $X_2$ may be C or N, the moiety represented by

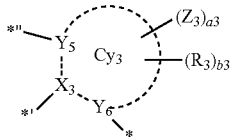

may be a group represented by Formula Cy3-1(5), and $X_3$ may be C.

In an embodiment, in Formula 1, the moiety represented by

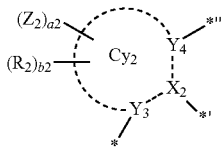

may be a group represented by Formula Cy2-1(5), $X_2$ may be C, the moiety represented by

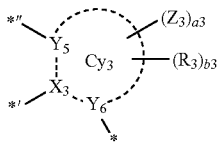

may be a group represented by Formula Cy3-1 (1), and $X_3$ may be C or N.

In an embodiment, in Formula 1, the moiety represented by

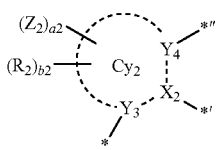

may be a group represented by Formula Cy2-1(5), the moiety represented by

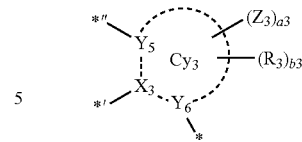

may be a group represented by Formula Cy3-1(5), and $X_2$ and $X_3$ may each independently be C or N, wherein at least one selected from $X_2$ and $X_3$ may be C.

In an embodiment, in Formula 1, the moiety represented by

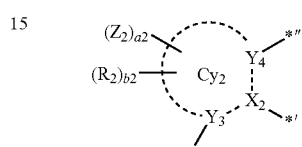

may be a group represented by Formula Cy2-1(5), the moiety represented by

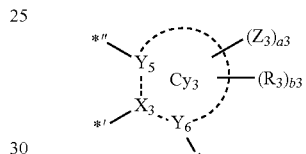

may be a group represented by Formula Cy3-1(5), and $X_2$ and $X_3$ may each be C, but embodiments of the present disclosure are not limited thereto.

In an embodiment, in Formula 1, the moiety represented by

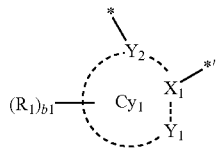

may be a group represented by one of Formulae Cy1-1, Cy1-14, and Cy1-15, the moiety represented by

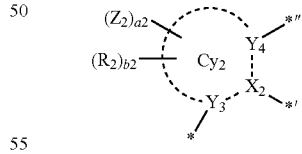

may be a group represented by one of Formulae Cy2-1(1) to Cy2-1(4), $X_2$ may be C or N, the moiety represented by

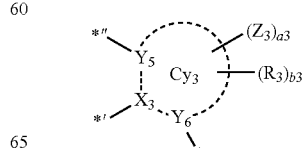

may be a group represented by one of Formulae Cy3-1(5) to Cy3-1(7), $X_3$ may be C, and the moiety represented by

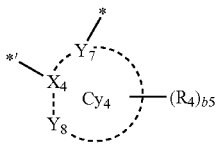

may be a group represented by one of Formulae Cy4-1, Cy4-14, and Cy4-15.

In an embodiment, in Formula 1, the moiety represented by

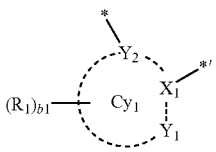

may be a group represented by one of Formulae Cy1-1, Cy1-14, and Cy1-15, the moiety represented by

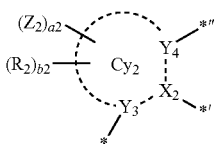

may be a group represented by one of Formulae Cy2-1(5) to Cy2-1(7), $X_2$ may be C, the moiety represented by

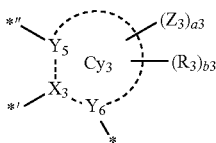

may be a group represented by one of Formulae Cy3-1(1) to Cy3-1(4), $X_3$ may be C or N, and the moiety represented by

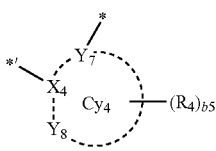

may be a group represented by one of Formulae Cy4-1, Cy4-14, and Cy4-15.

In one or more embodiments, in Formula 1, the moiety represented by

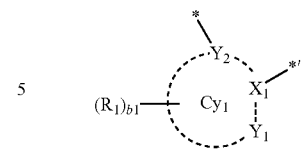

may be a group represented by one of Formulae Cy1-1, Cy1-14, and Cy1-15, the moiety represented by

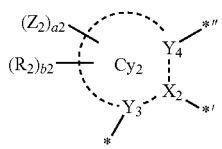

may be a group represented by one of Formulae Cy2-1(5) to Cy2-1(7), the moiety represented by

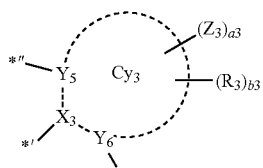

may be a group represented by one of Formulae Cy3-1(5) to Cy3-1(7), $X_2$ and $X_3$ may each independently be C or N, at least one selected from $X_2$ and $X_3$ may be C, and the moiety represented by

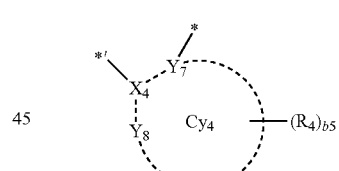

may be a group represented by one of Formulae Cy4-1, Cy4-14, and Cy4-15.

In one or more embodiments, in Formula 1, the moiety represented by

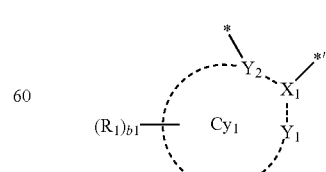

may be a group represented by one of Formulae Cy1-1, Cy1-14, and Cy1-15, the moiety represented by

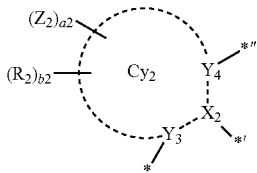

may be a group represented by Formula Cy2-1(1), $X_2$ may be C or N, the moiety represented by

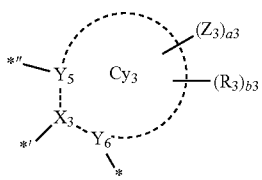

may be a group represented by Formula Cy3-1(5), $X_3$ may be C, and the moiety represented by

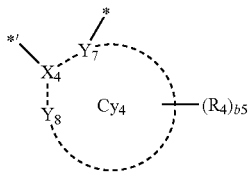

may be a group represented by one of Formulae Cy4-1, Cy4-14, and Cy4-15.

In one or more embodiments, in Formula 1, the moiety represented by

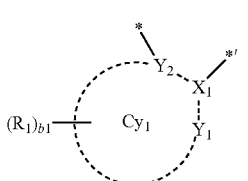

may be a group represented by one of Formulae Cy1-1, Cy1-14, and Cy1-15, the moiety represented by

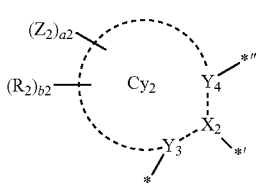

may be a group represented by Formula Cy2-1(5), $X_2$ may be C, the moiety represented by

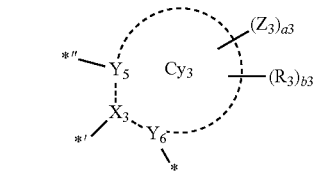

may be a group represented by Formula Cy3-1(1), $X_3$ may be C or N, and the moiety represented by

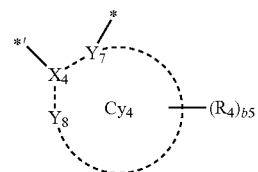

may be a group represented by one of Formulae Formula Cy4-1, Cy4-14, and Cy4-15.

In one or more embodiments, in Formula 1, the moiety represented by

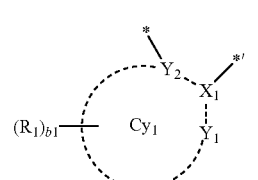

may be a group represented by one of Formulae Cy1-1, Cy1-14, and Cy1-15, the moiety represented by

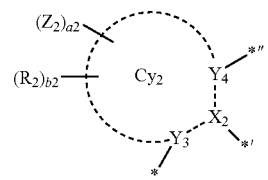

may be a group represented by Formula Cy2-1(5), the moiety represented by

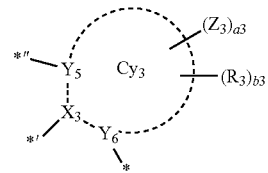

may be a group represented by Formula Cy3-1(5), $X_2$ and $X_3$ may each independently be C or N, wherein at least one selected from $X_2$ and $X_3$ may be C, and the moiety represented by

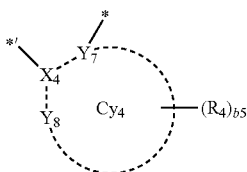

may be a group represented by one of Formulae Cy4-1, Cy4-14, and Cy4-15.

In one or more embodiments, in Formula 1, the moiety represented by

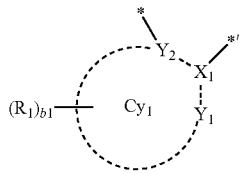

may be a group represented by one of Formulae Cy1-1, Cy1-14, and Cy1-15, the moiety represented by

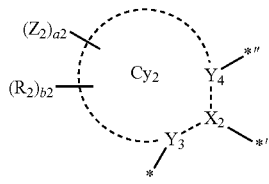

may be a group represented by Formula Cy2-1(5), the moiety represented by

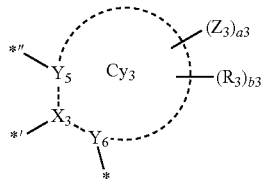

may be a group represented by Formula Cy3-1(5), $X_2$ and $X_3$ may each be C, the moiety represented by

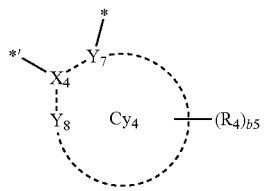

may be a group represented by one of Formulae Cy4-1, Cy4-14, and Cy4-15, but embodiments of the present disclosure are not limited thereto.

For example, the organometallic compound may be one of Compounds 1 to 9, but embodiments of the present disclosure are not limited thereto:

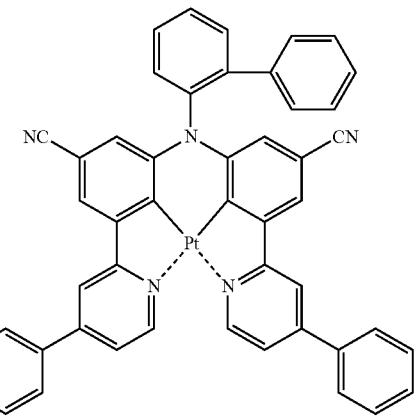

1

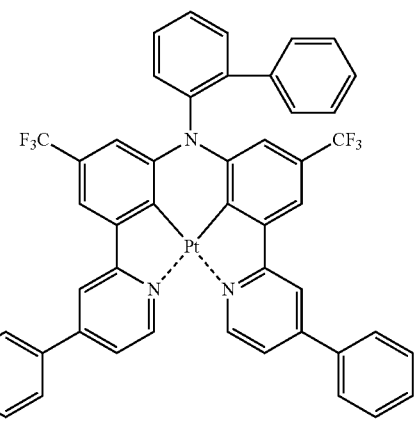

2

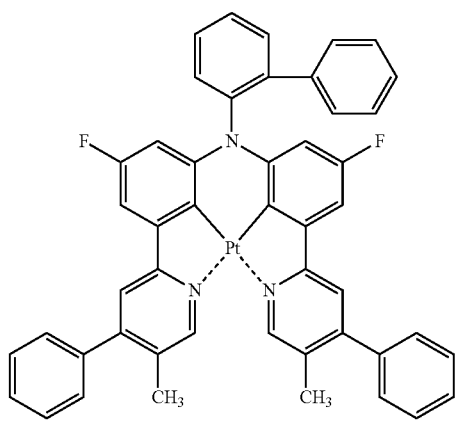

3

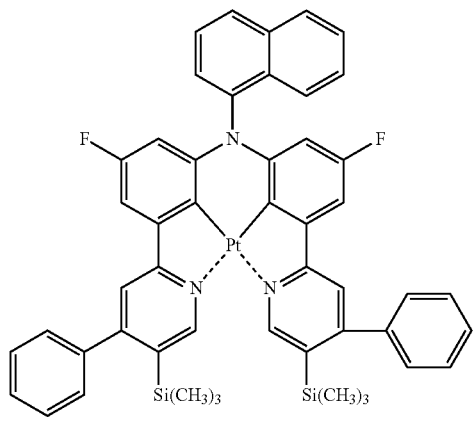

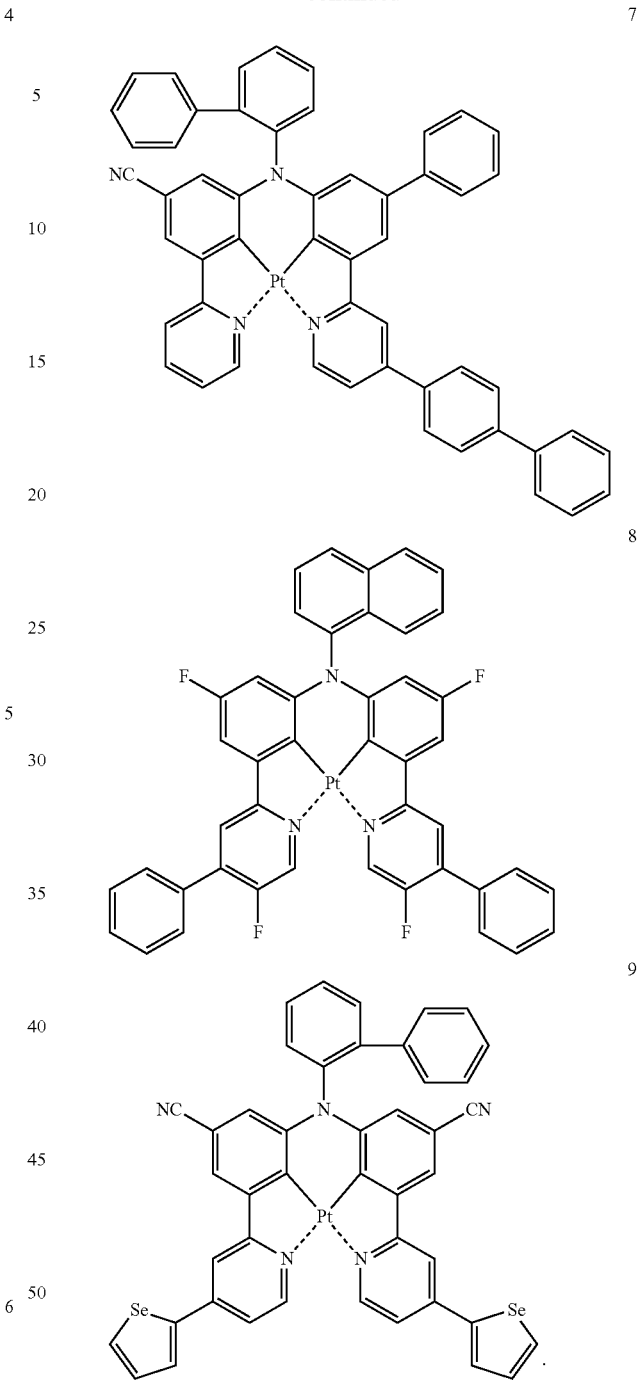

$T_1$ to $T_3$ in Formula 1 may each independently be *-O-*', *-S-*', *-C($R_5$)($R_6$)-*', *-C($R_5$)=*', *=C($R_5$)-*', *-C($R_5$)=C($R_6$)-*', *-C≡C-*', *-N($R_5$)-*', *-Si($R_5$)($R_6$)-*', and *-P($R_5$)($R_6$)-*'. Each of $T_1$ to $T_3$ may not be *-P(=O)$R_5$-*'. When an organometallic compound includes *-P(=O)($R_5$)-*' as a linker, non-radiative transition may occur. Accordingly, an organometallic compound including *-P(=O)($R_5$)-*' as a linker may have a relatively short lifespan. However, when, *-O-*', *-S-*', *-C($R_5$)($R_6$)-*', *-C($R_5$)=*', *=C($R_5$)-*', *-C($R_5$)=C($R_6$)-*', *-C≡C-*', *-N($R_5$)-*', *-Si($R_5$)($R_6$)-*' and/or *-P($R_5$)

($R_6$)—*' are included as a linker in an organometallic compound, an organic light-emitting device including such an organometallic compound may have a relatively long lifespan.

In Formula 1, when each of $X_2$ and $X_3$ is C, at least one selected from $Cy_2$ and $Cy_3$ may necessarily include $Z_2$ or $Z_3$; when $X_2$ is C and $X_3$ is N, $Cy_2$ may necessarily include $Z_2$; and when $X_2$ is N and $X_3$ is C, $Cy_3$ may necessarily include $Z_3$. In these cases, oscillation strength may be increased, and thus, luminescent efficiency may be increased. While not wishing to be bound by theory, it is understood that when $Cy_2$ or $Cy_3$ is a benzene group and $Z_2$ or $Z_3$ is positioned in a para-location with respect to metal M, oscillation strength may be further increased.

For example, the highest occupied molecular orbital (HOMO), the lowest unoccupied molecular orbital (LUMO), a singlet ($S_1$) energy level, and a triplet ($T_1$) energy level of Compounds 1 to 9 were evaluated by using a DFT method of Gaussian program (B3LYP, structurally optimized at least one the level of 6-31G(d,p)). Results obtained therefrom are shown in Table 1 below.

TABLE 1

| Compound No. | HOMO (eV) | LUMO (eV) | $S_1$ energy level (eV) | $T_1$ energy level (eV) |
| --- | --- | --- | --- | --- |
| 1 | −5.05 | −2.25 | 2.23 | 1.98 |
| 2 | −4.82 | −2.05 | 2.16 | 1.97 |
| 3 | −4.69 | −2.03 | 2.10 | 1.90 |
| 4 | −4.54 | −1.77 | 2.16 | 1.93 |
| 5 | −5.13 | −2.37 | 2.22 | 1.96 |
| 6 | −4.82 | −2.08 | 2.16 | 1.94 |
| 7 | −4.77 | −2.03 | 2.12 | 1.95 |
| 8 | −4.69 | −2.03 | 2.09 | 1.90 |
| 9 | −5.08 | −2.43 | 2.10 | 1.89 |

From Table 1, it can be seen that the organometallic compound represented by Formula 1 has electrical characteristics suitable for use in an electrical device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compound" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIG. 1s a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be utilized, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0 (Angstroms per second) Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

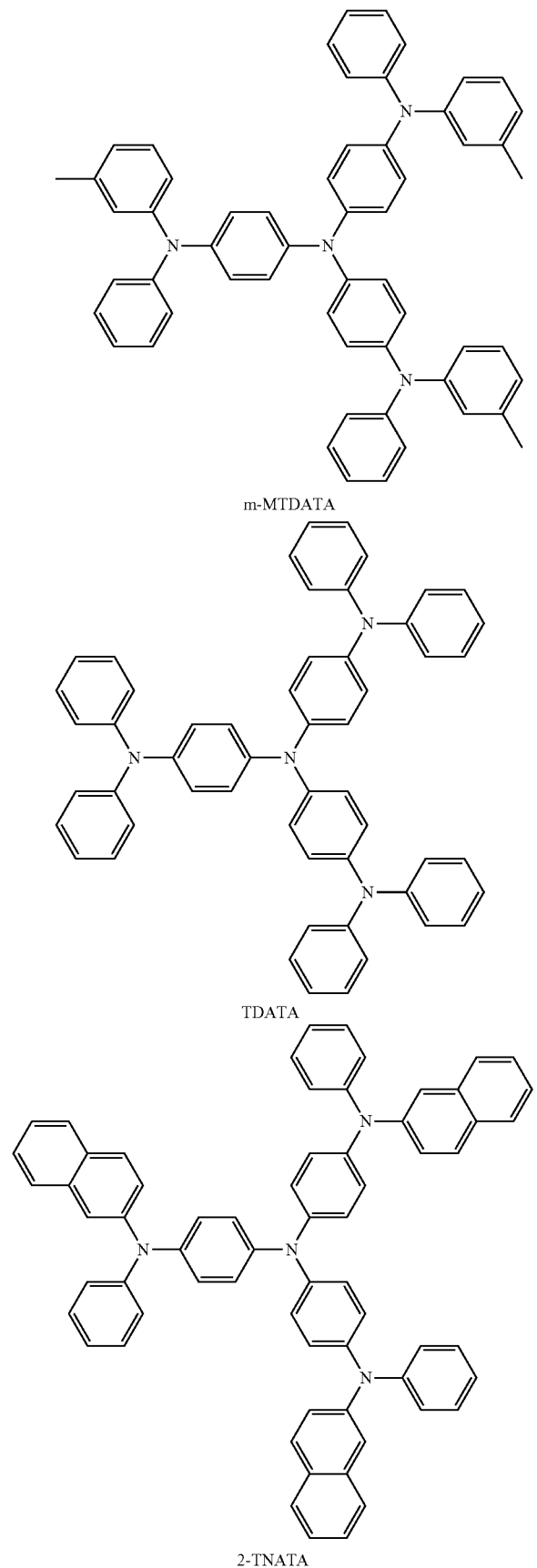

m-MTDATA

TDATA

2-TNATA

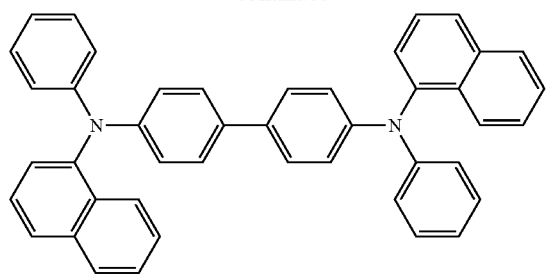
NPB
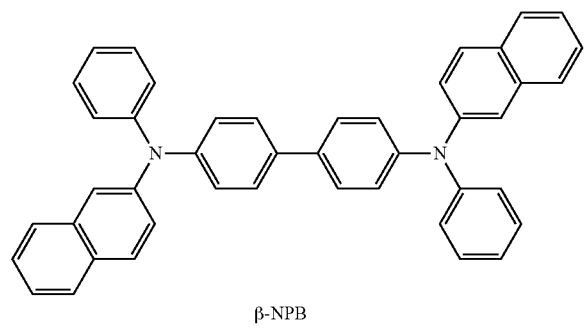
β-NPB
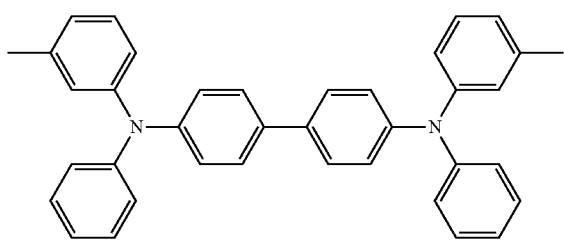
TPD
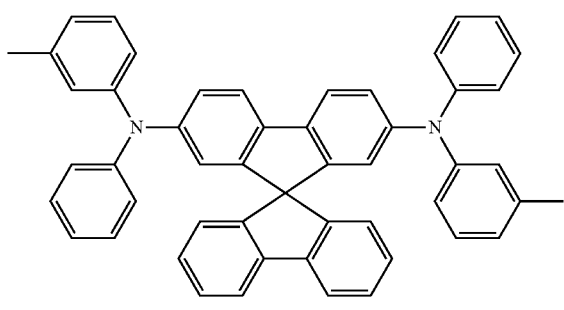
Spiro-TPD
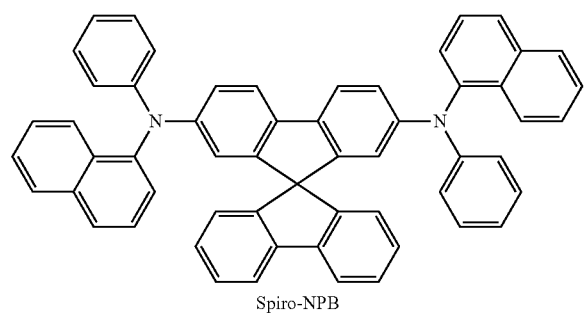
Spiro-NPB
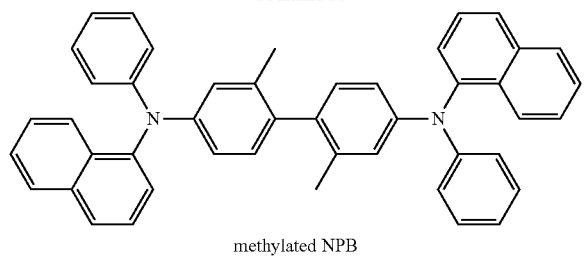
methylated NPB
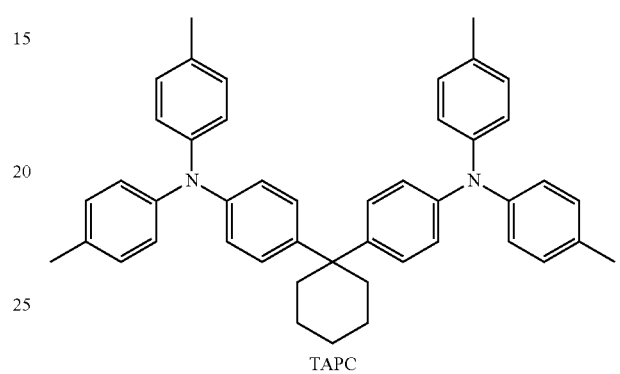
TAPC
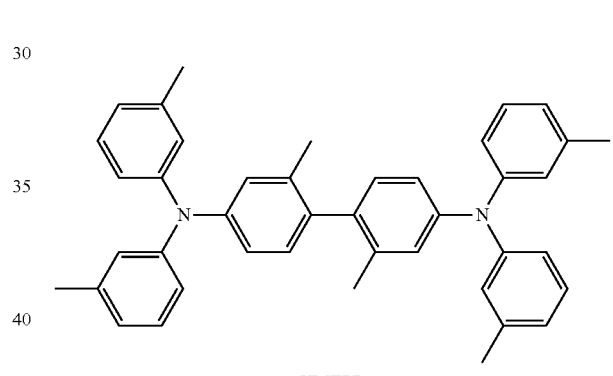
HMTPD
Formula 201
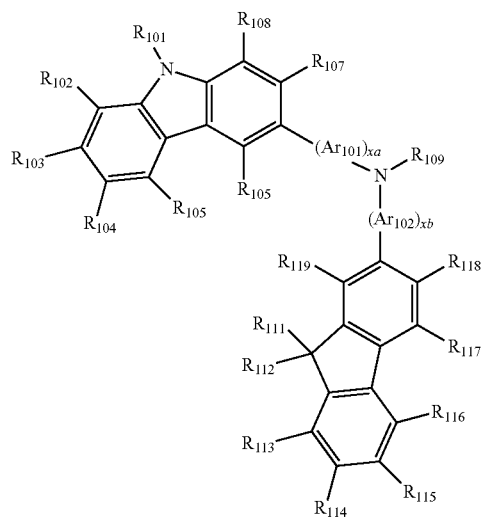

Formula 202

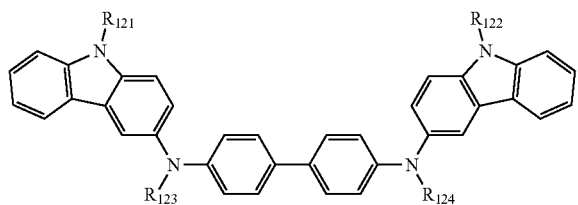

$Ar_{101}$ and $Ar_{102}$ in Formula 201 may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc.), and a $C_1$-$C_{10}$ alkoxy group (for example, a methoxy group, an ethoxy group, a propoxy group, a butoxy group, a pentoxy group, etc.);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, or a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A below, but embodiments of the present disclosure are not limited thereto:

Formula 201A

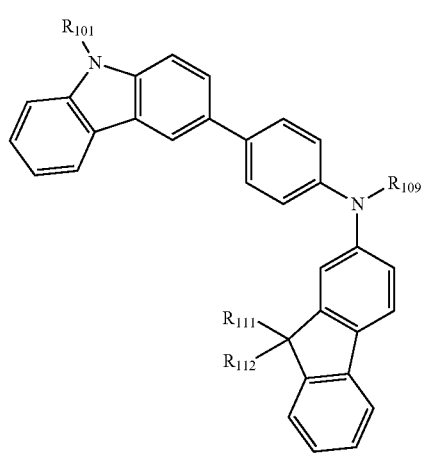

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1
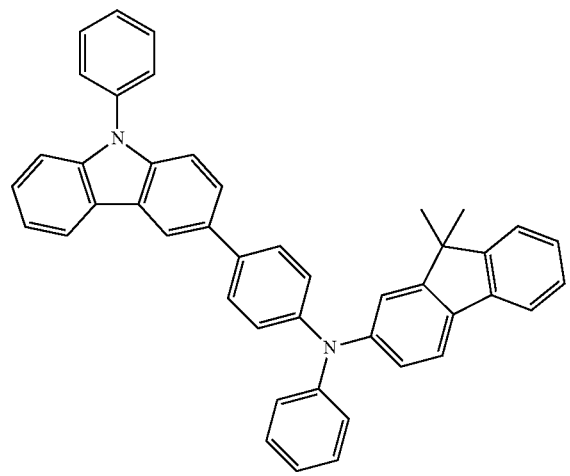
HT2
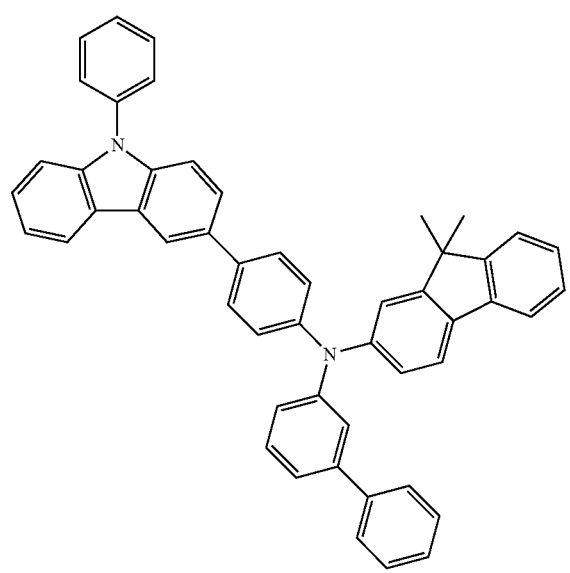
HT3
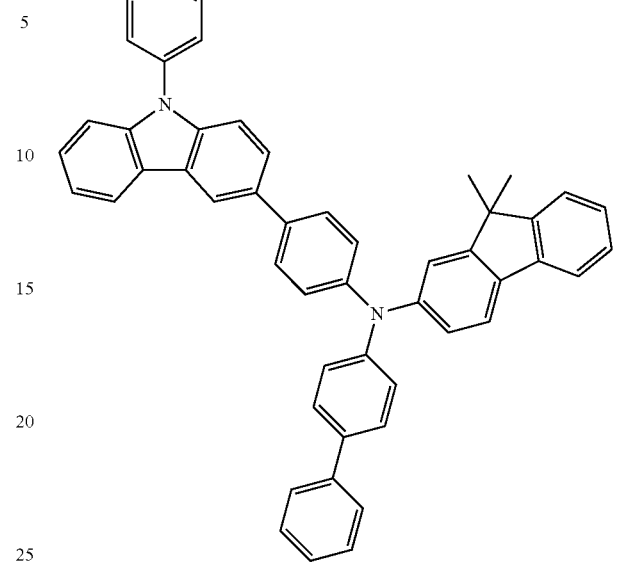
HT4
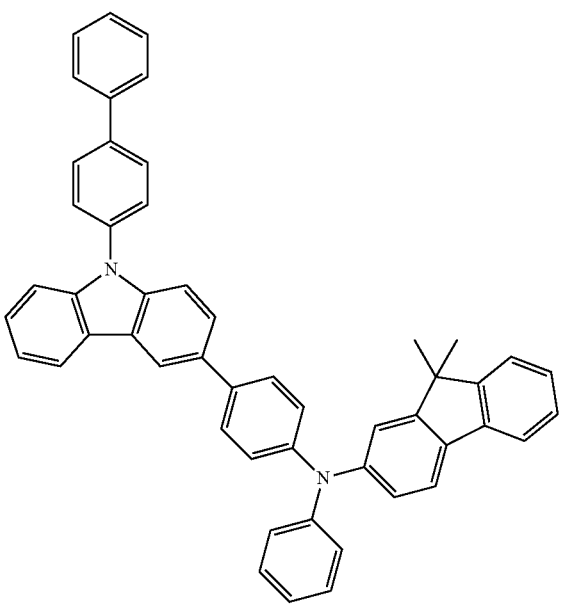

HT5
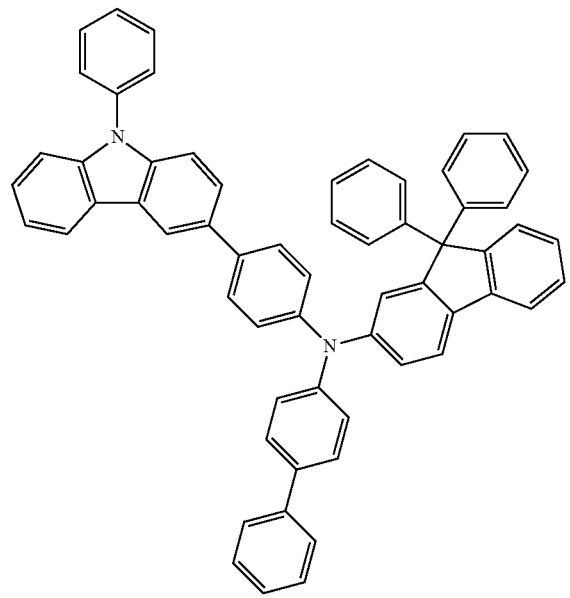
HT6
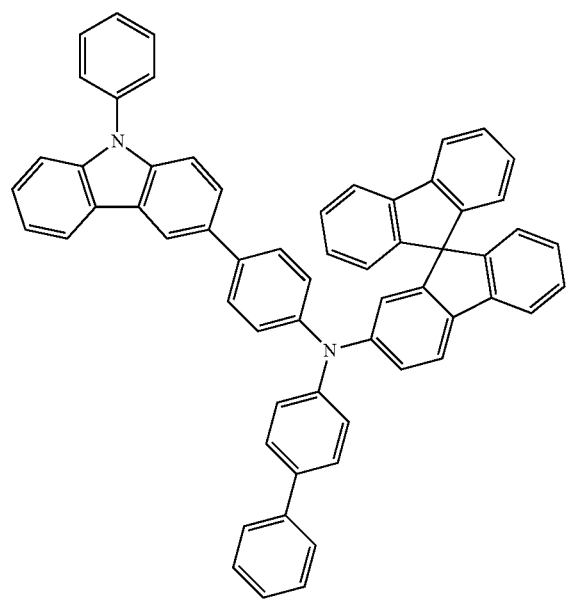
HT7
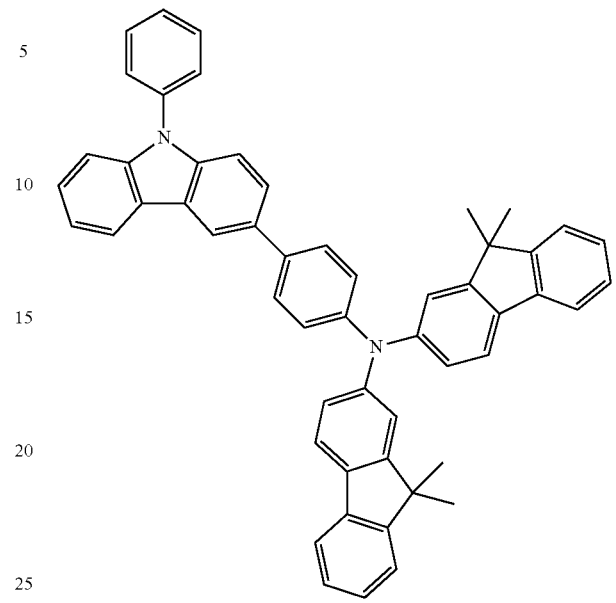
HT8
HT9
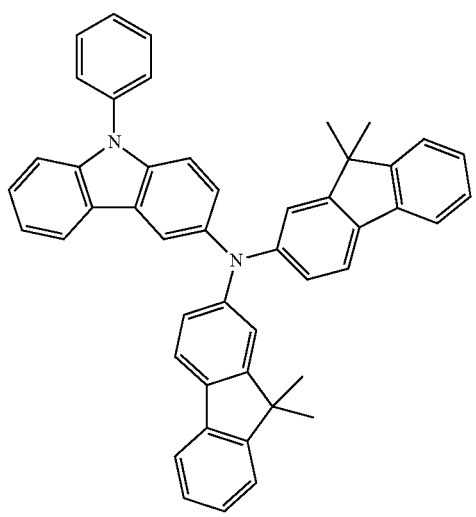

HT10
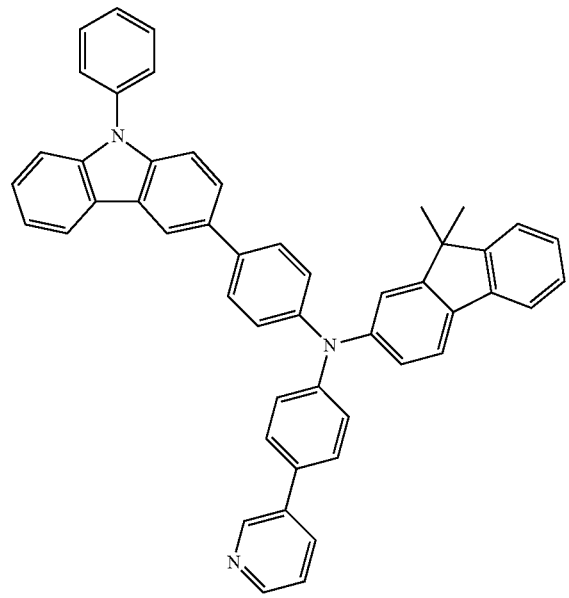
HT11
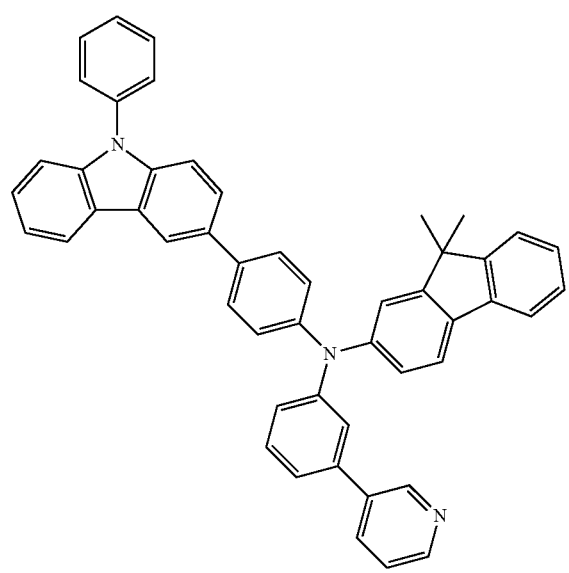
HT12
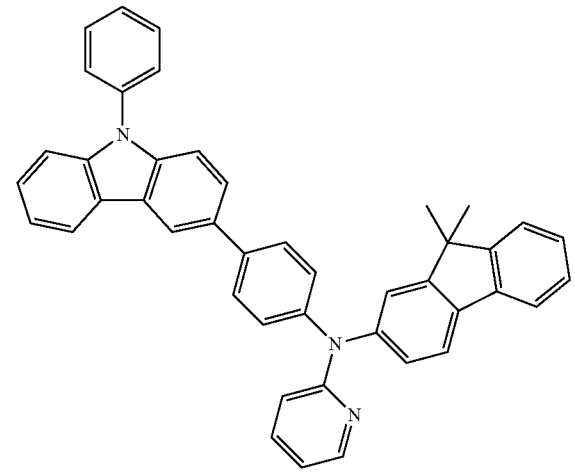
HT13
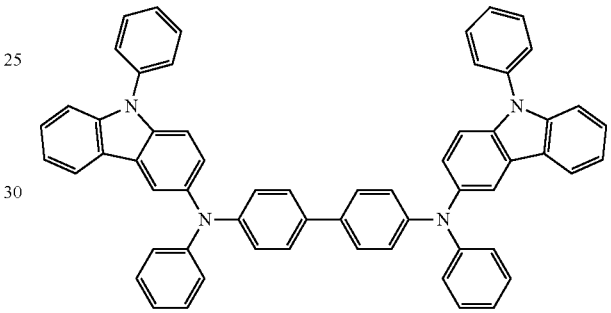
HT14
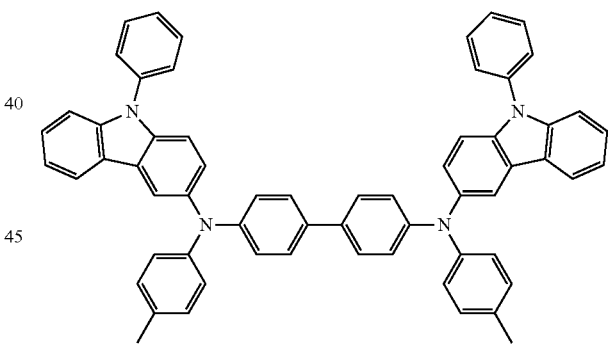
HT15
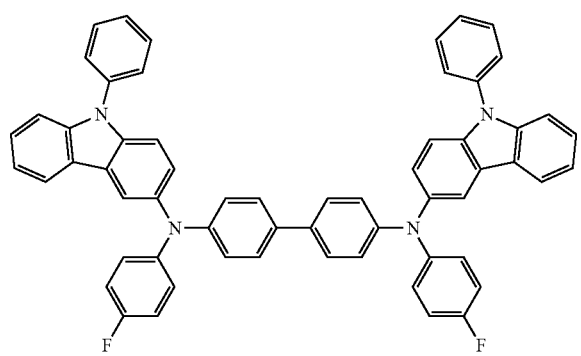

HT16

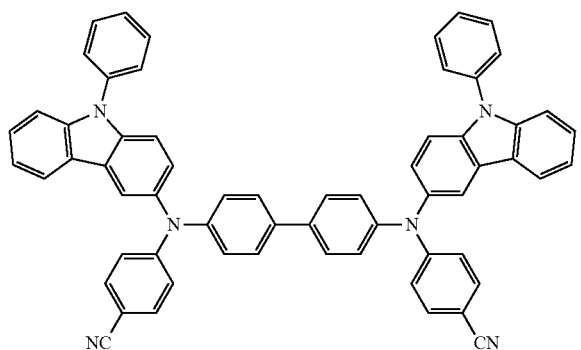

HT20

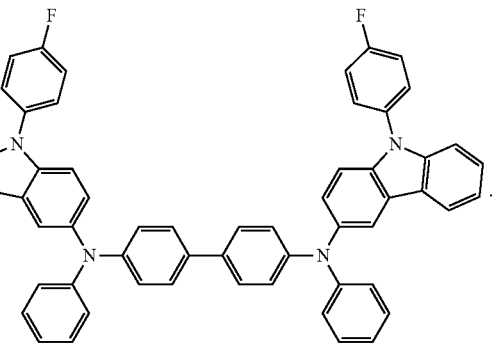

HT17

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

HT18

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

HT19

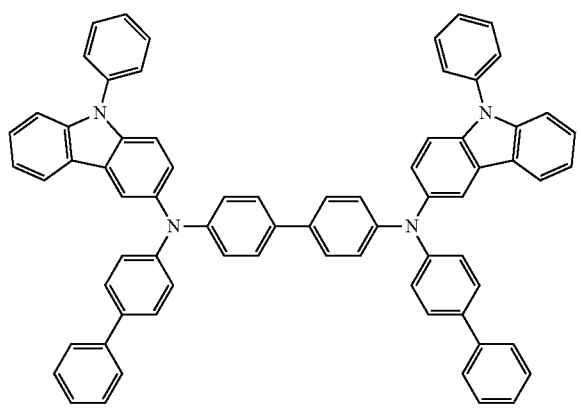

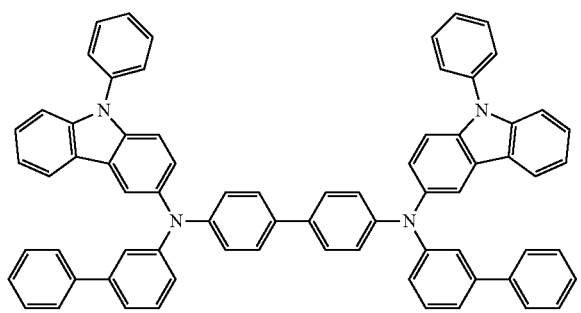

Compound HT-D1

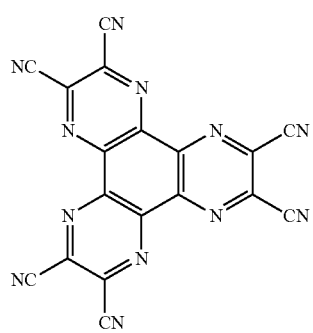

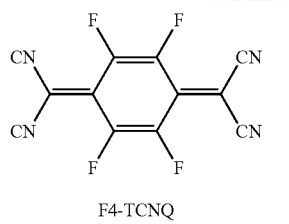

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer, although the deposition or coating conditions may vary according to a material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

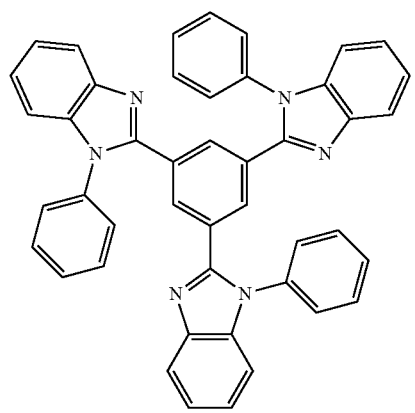

TPBi

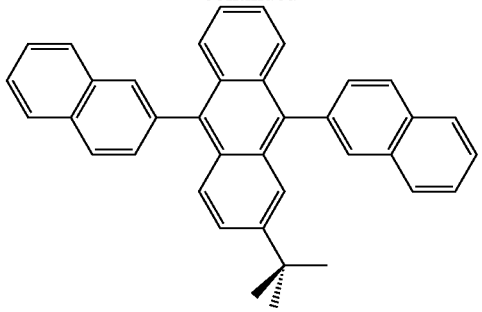

TBADN

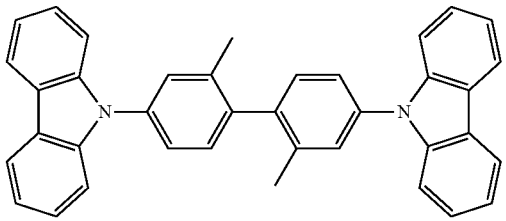

ADN

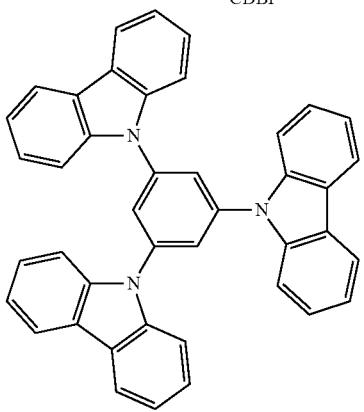

CBP

CDBP

TCP

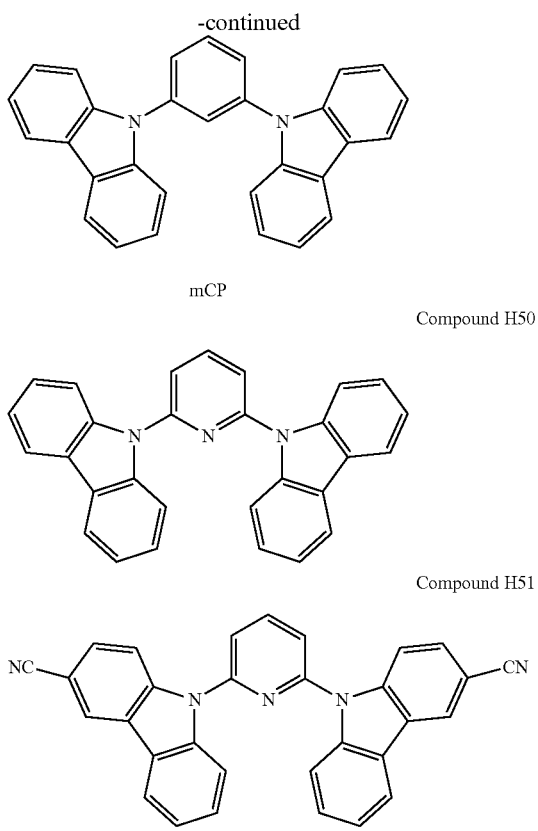

mCP

Compound H50

Compound H51

In one or more embodiments, the host may further include a compound represented by Formula 301 below.

Formula 301

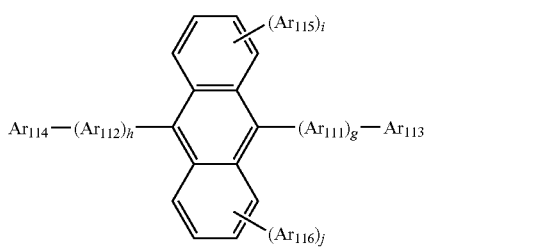

$Ar_{111}$ and $Ar_{112}$ in Formula 301 may each independently be selected from a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ and $Ar_{116}$ in Formula 301 may each independently be selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

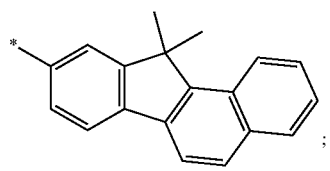 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

The compound represented by Formula 301 and the compound represented by Formula 302 may include Compounds H1 to H42 illustrated below, but are not limited thereto.

H1

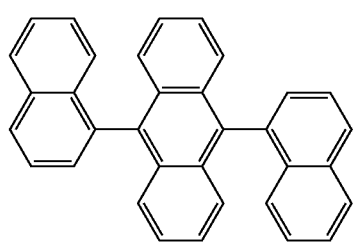

-continued
H2
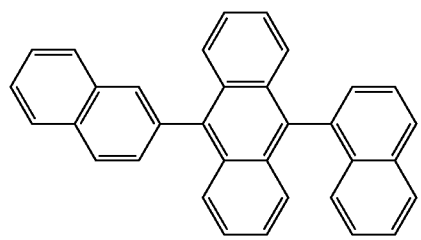
H3
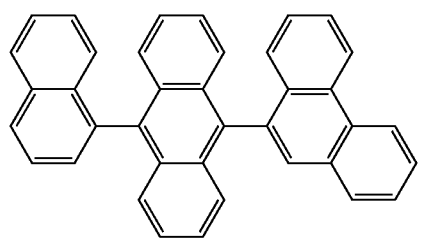
H4
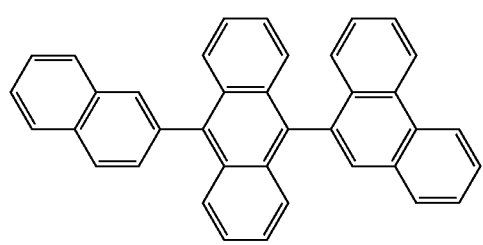
H5
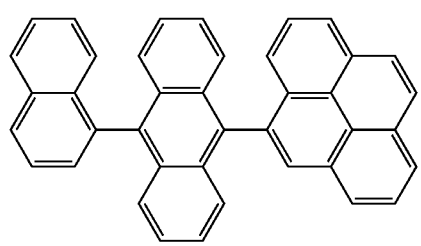
H6
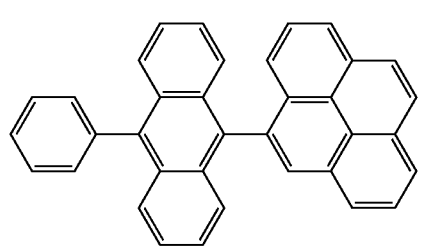
H7
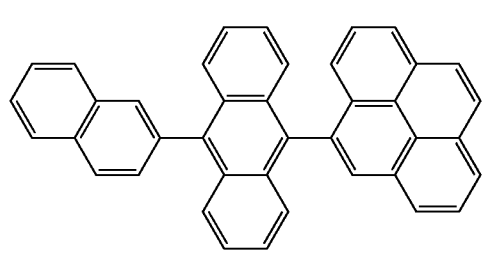
-continued
H8
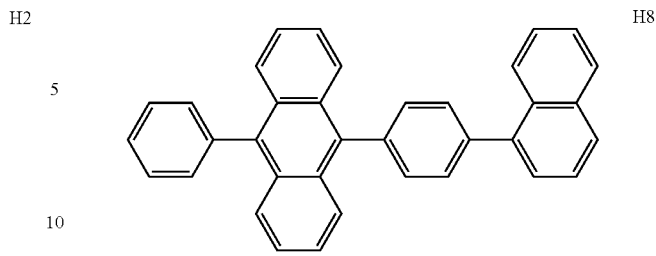
H9
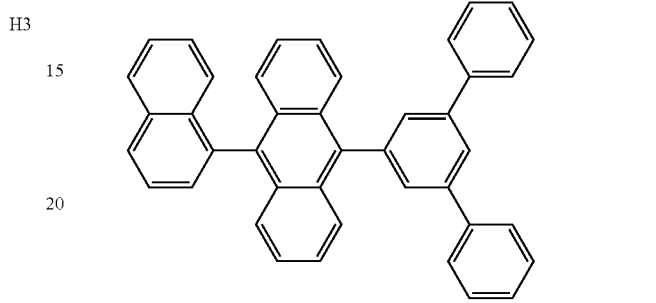
H10
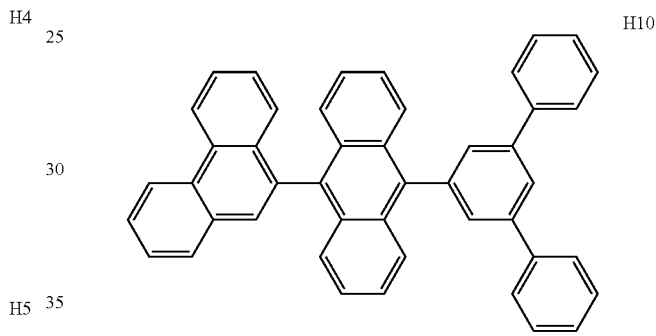
H11
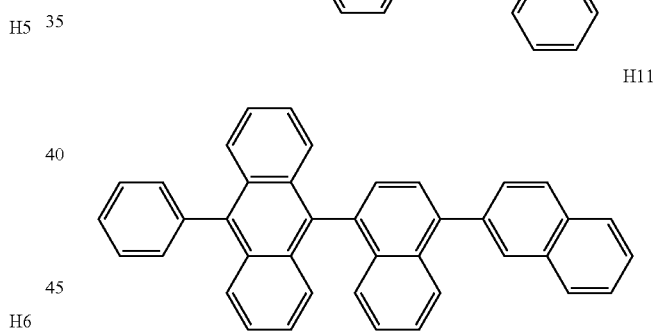
H12
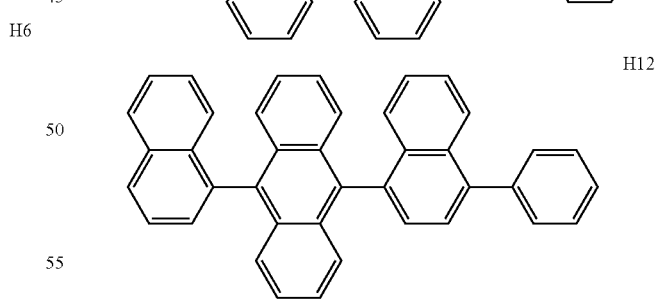
H13
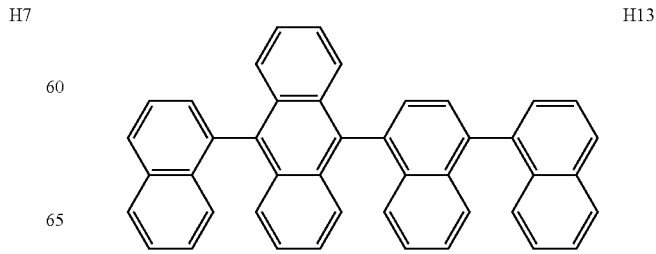

H14
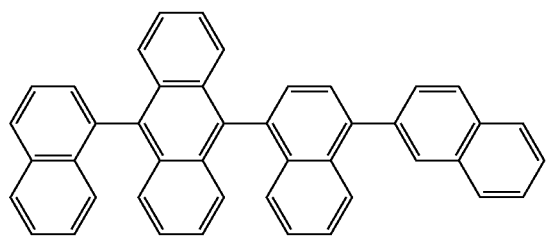
H15
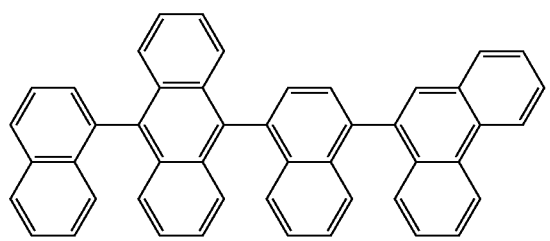
H16
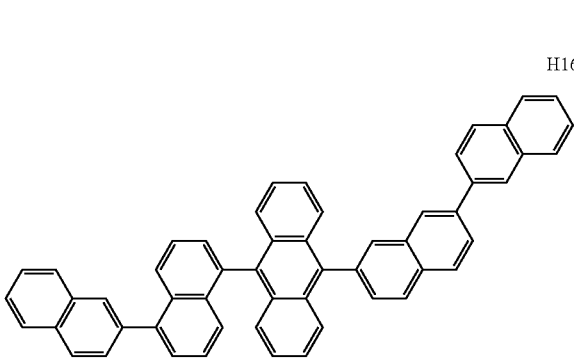
H17
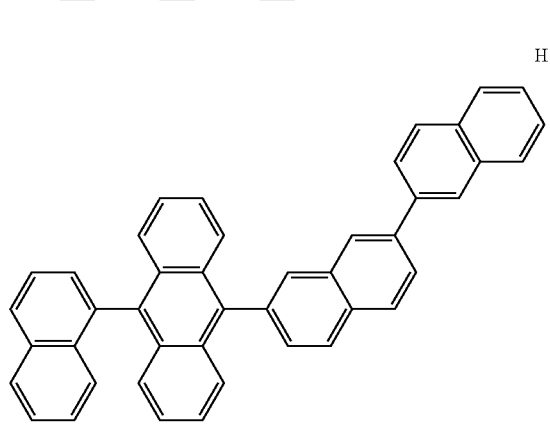
H18
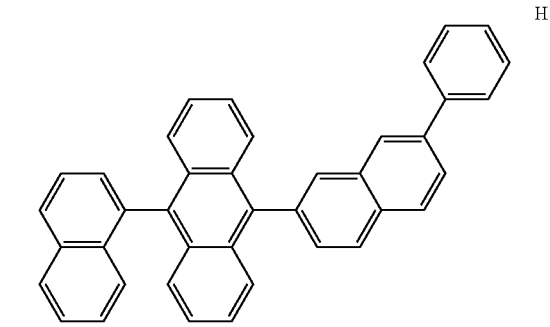
H19
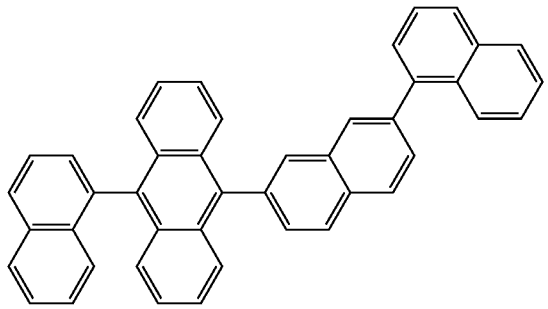
H20
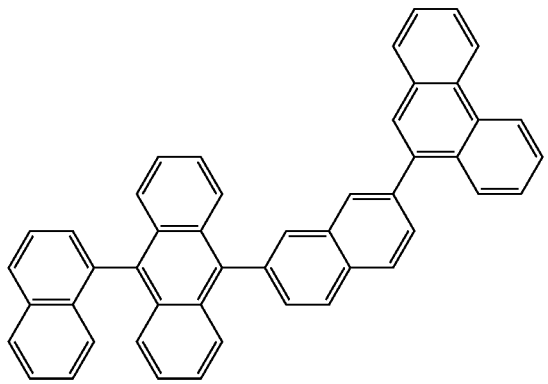
H21
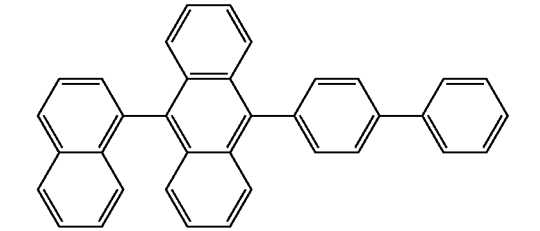
H22
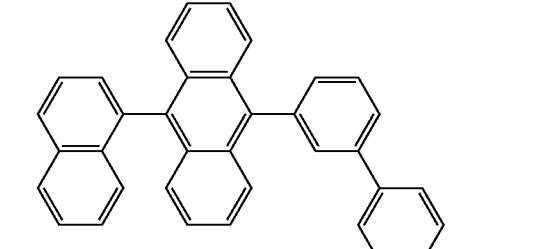
H23
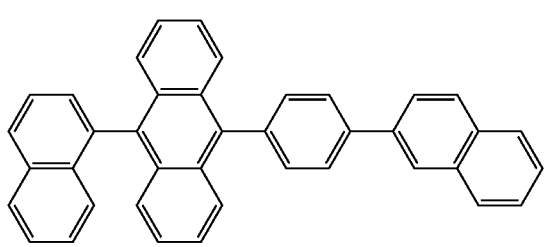

H24
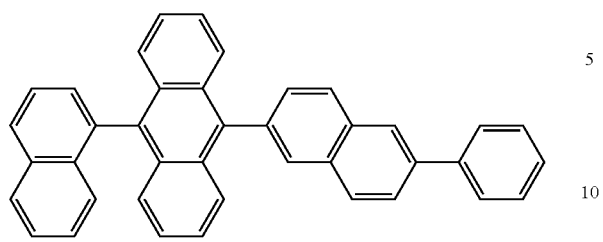
H25
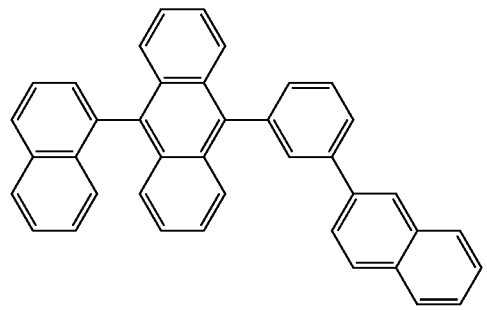
H26
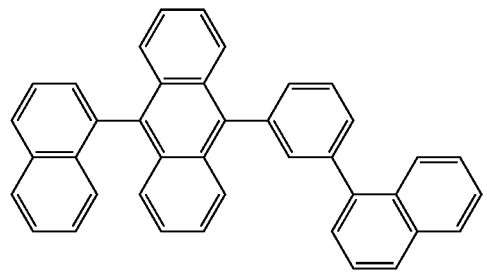
H27
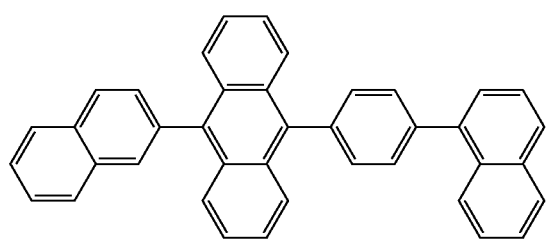
H28
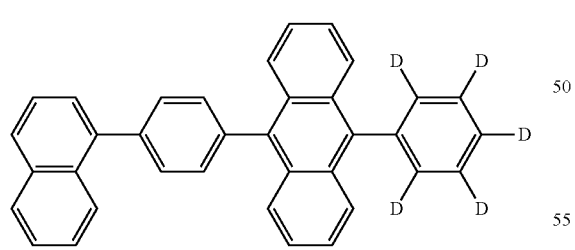
H29
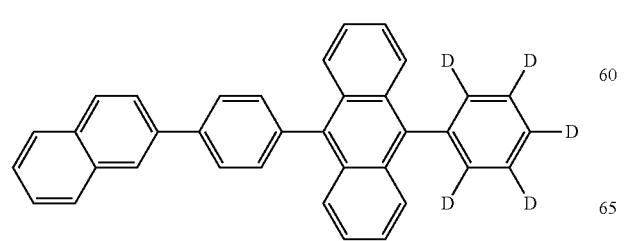
H30
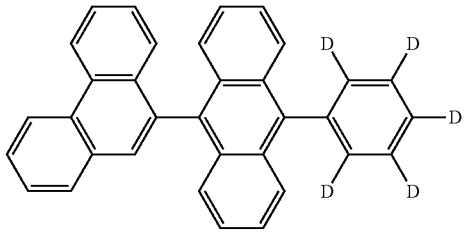
H31
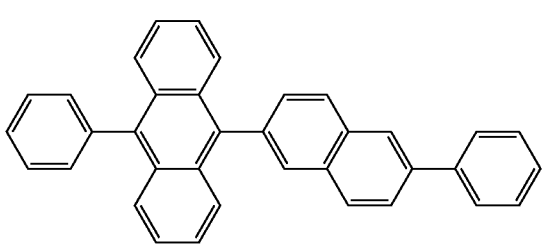
H32
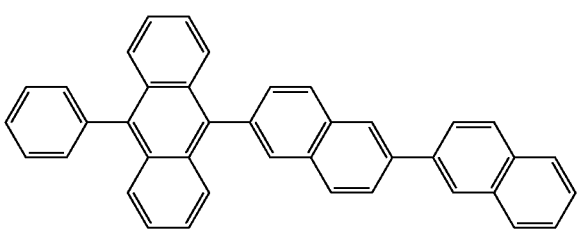
H33
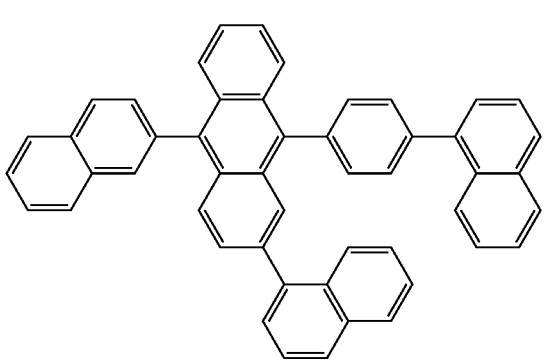
H34
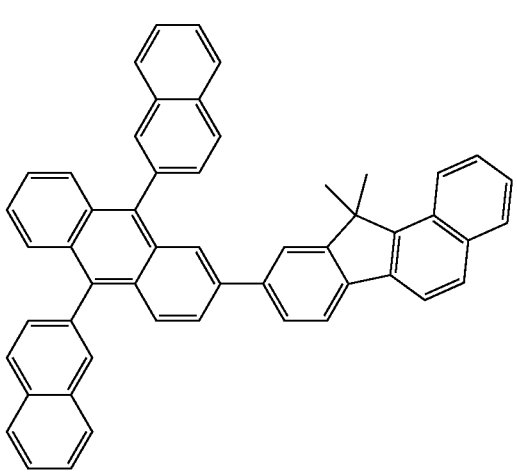

-continued
H35
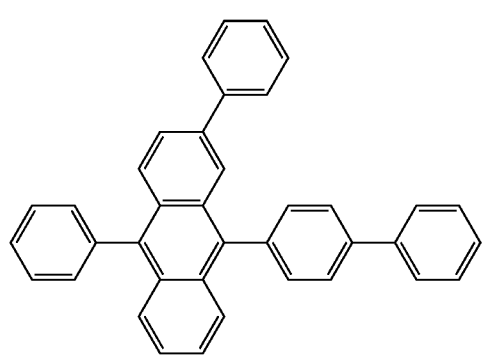
H36
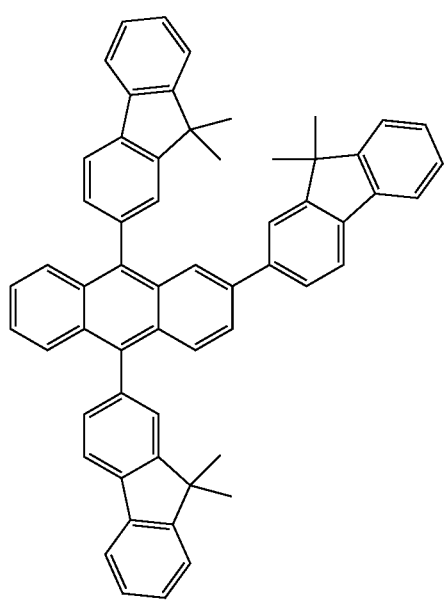
H37
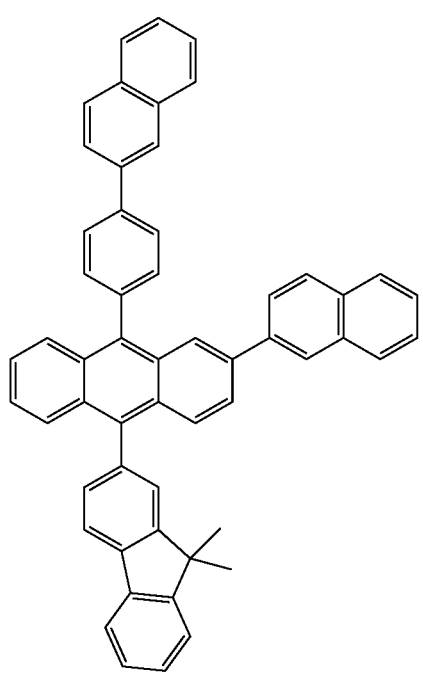
-continued
H38
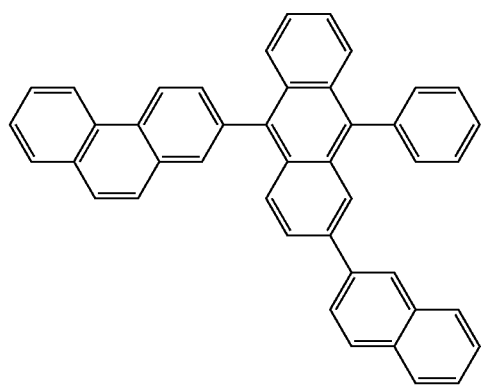
H39
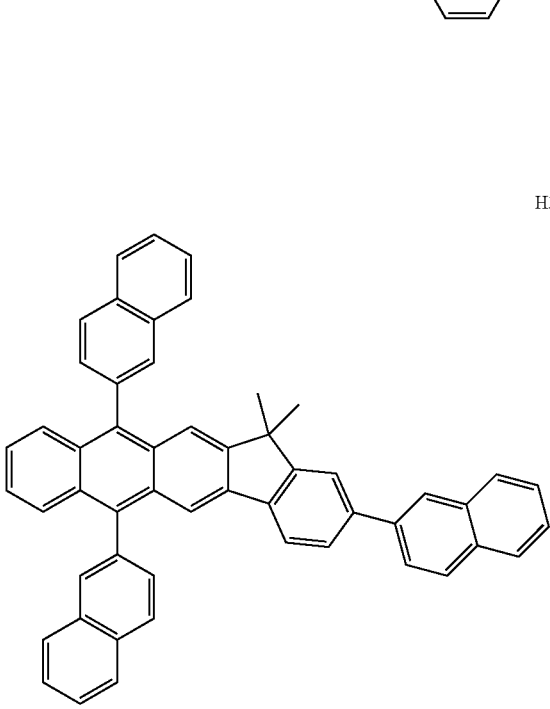
H40
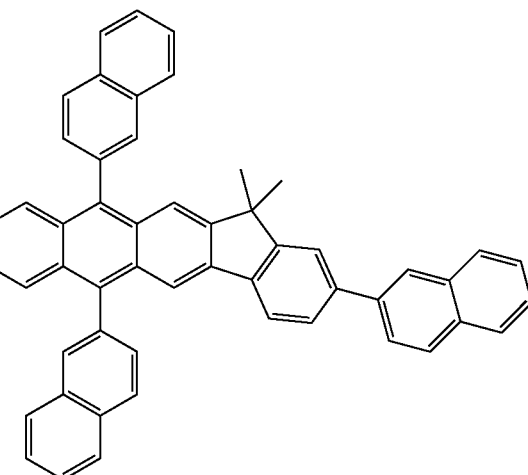

H41

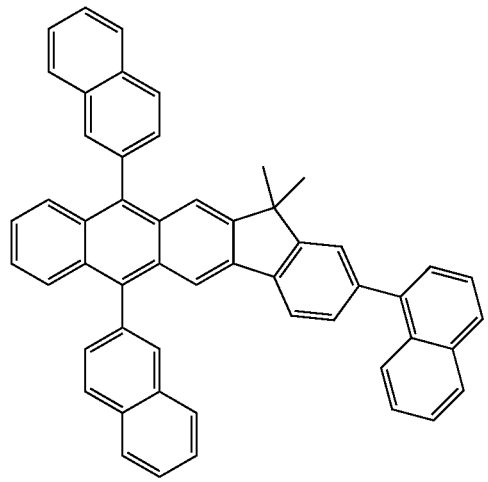

H42

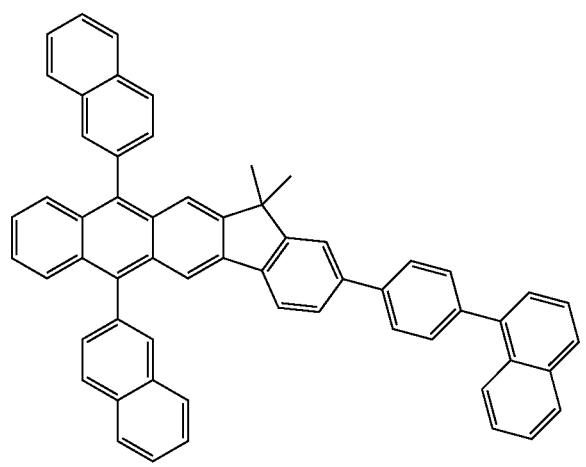

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

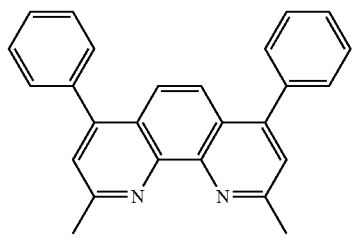

BCP

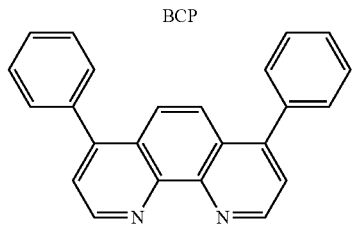

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may further include, in addition to the organometallic compound represented by Formula 1, at least one selected from BOP, Bphen, Alq$_3$, BAlq, TAZ, and NTAZ.

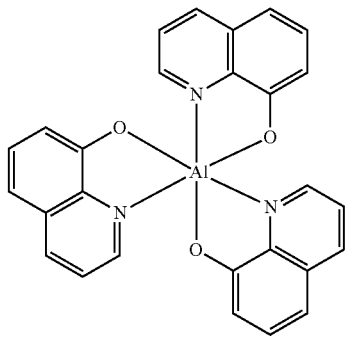

Alq$_3$

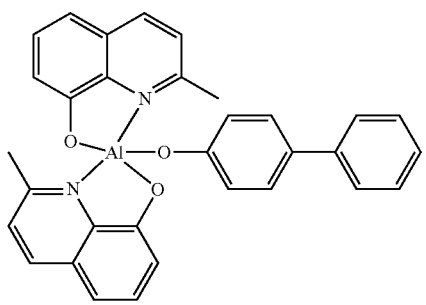

BAlq

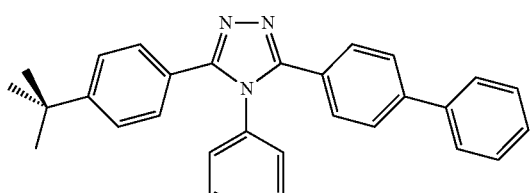

TAZ

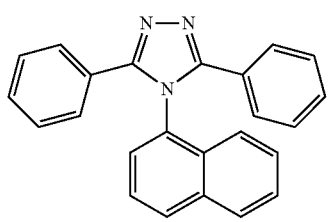

NTAZ

In one or more embodiments, the electron transport layer may include at least one of ET1 and ET2, but is not limited thereto:

ET1

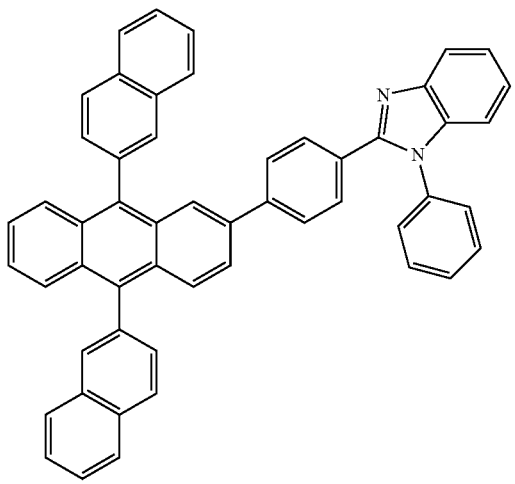

ET2

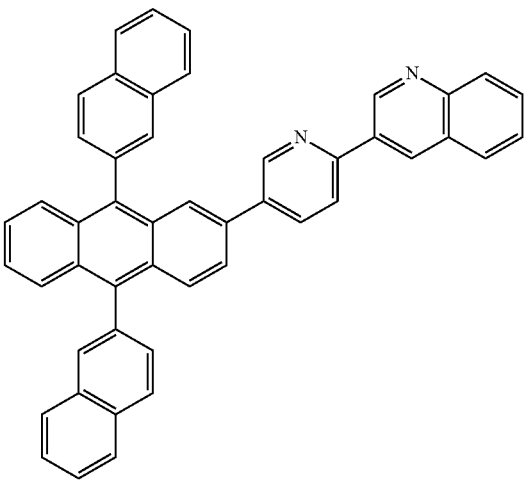

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

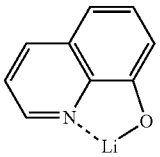

ET-D2

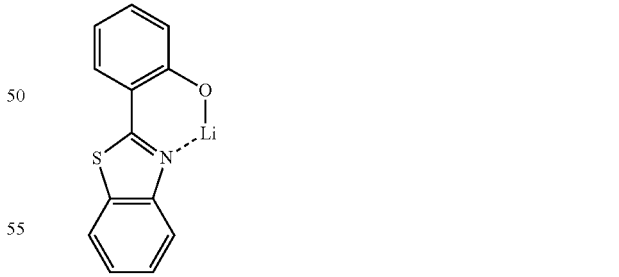

The electron transport region may include an electron injection layer (EIL) that promotes electron flow from the second electrode 19 thereinto.

The electron injection layer may include at least one selected from LiF, NaCl, CsF, $Li_2O$, and BaO.

A thickness of the electron injection layer may be in a range of about 1 Å to about 100 Å, and, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission-type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an iso-propyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, at least one carbon-carbon double bond in the ring thereof, which is not aromatic, and non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group," as used herein, refers to a monovalent group having a cyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, in addition to 1 to 60 carbon atoms. Examples of the $C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and which is not aromatic in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and which is not aromatic in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S, other than 1 to 30 carbon atoms. The term $C_1$-$C_{30}$ heterocyclic group may be a monocyclic group or a polycyclic group.

At least one substituent of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$;

wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to embodiments are described in detail with reference to Synthesis Examples and Examples. However, the organic light-emitting device is not limited thereto. The wording "B was used instead of A" used in describing the Synthesis Examples means that molar equivalents of A used were identical to molar equivalents of B used.

EXAMPLES

Synthesis Example 1: Synthesis of Compound 1

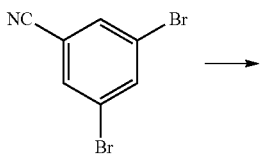

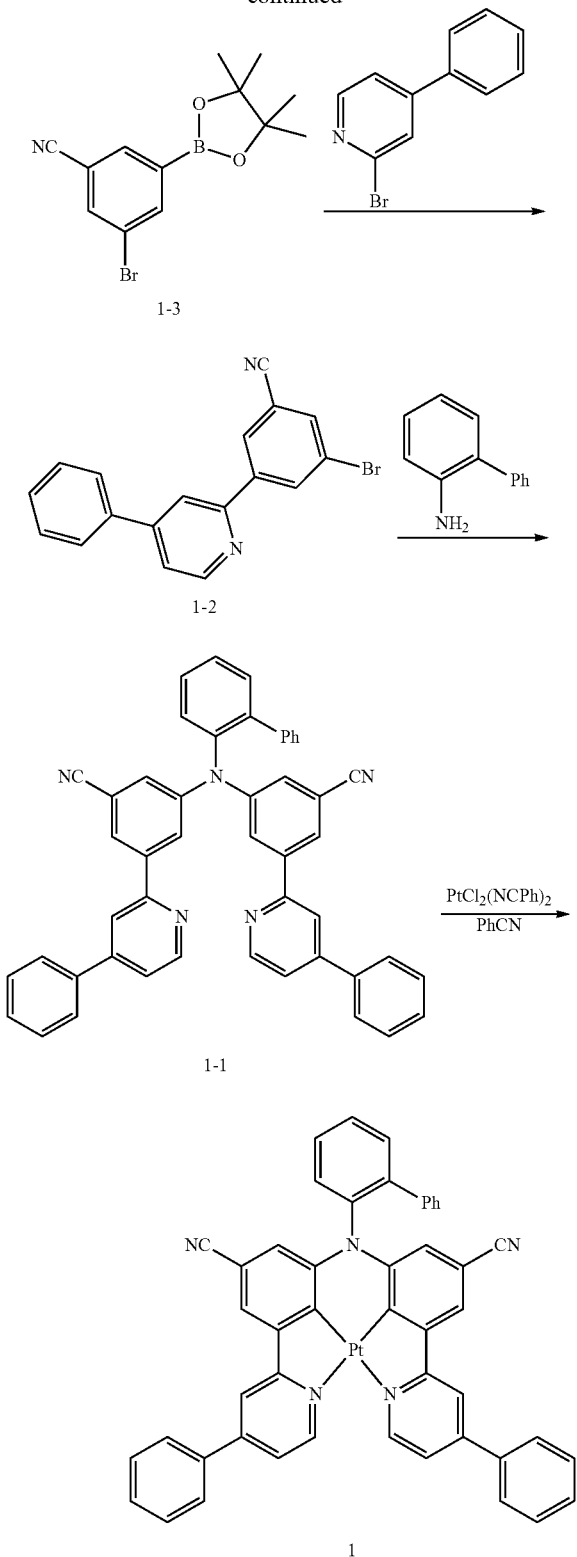

1) Synthesis of Intermediate 1-3

12.0 grams (g) (46.0 millimoles, mmol) of 3,5-dibromobenzonitrile was dissolved in 200 milliliters (ml) of anhydrous tetrahydrofuran (THF) in a reactor, and 14.0 g (55.2 mmol) of bis(pinacolate)diboron was added thereto. 1.6 g (2.30 mmol) of PdCl₂(PPh₃)₂ and 13.5 g (137.9 mmol) of potassium acetate were added to the mixture, which was then heated at a temperature of 85° C. or lower for 12 hours. Once the reaction was completed, 200 ml of ethyl acetate and 300 ml of distilled water were added to the resultant mixture to perform an extraction. The organic layer was dried by using magnesium sulfate, and the solvent was evaporated under reduced pressure. The resultant product was purified by column chromatography to obtain about 8.0 g (25.8 mmol, yield of 56%) of Intermediate 1-3. The obtained compound was confirmed by $^1$H NMR.

$^1$H NMR (300 MHz, CDCl₃) δ=8.15-8.14 (m, 1H), 8.02-8.01 (m, 1H), 7.86-7.85 (m, 1H), 1.36 (s, 12H).

2) Synthesis of Intermediate 1-2

6.9 g (22.5 mmol) of Intermediate 1-3 and 4.4 g (18.7 mmol) of 2-bromo-4-phenylpyridine were added to a reactor, and 60 ml of toluene, 20 ml of distilled water, and 20 ml of ethanol were added thereto. Then, 1.51 g (1.31 mmol) of Pd(PPh₃)₄ and 6.5 g (47.0 mmol) of potassium carbonate were added thereto, and the resultant mixture was heated under reflux at a temperature of 105° C. for 16 hours. Once the reaction was completed, the mixture was concentrated under reduced pressure, dissolved in 120 ml of dichloromethane, and filtered by passing through diatomite earth. 60 ml of water was added to an organic layer to perform an extraction. The combined organic extract were dried by using magnesium sulfate, and the solvent was removed under reduced pressure. The resultant product was purified by column chromatography to obtain about 2.7 g (7.8 mmol, yield of 41%) of Intermediate 1-2. The obtained compound was confirmed by LC-MS analysis. LC-MS m/z=335 (M+H)⁺.

3) Synthesis of Intermediate 1-1

2.7 g (8.0 mmol) of Intermediate 1-2 and 80 ml of toluene were added to a reactor. 0.64 g (3.8 mmol) of 2-aminobiphenyl, 0.3 g (1.2 mmol) of Pd(dba)₂, 0.5 g (1.2 mmol) of tri-Butyl phosphine (50 percent by weight, wt % in toluene), and 1.1 g (11.5 mmol) of sodium butoxide were added thereto, and the mixture was heated under reflux at a temperature of 110° C. for 24 hours. Once the reaction was complete, the mixture was then concentrated under reduced pressure, dissolved in 400 ml of dichloromethane, and filtered by passing through diatomite earth. The organic layer was concentrated under reduced pressure and purified by liquid chromatography, thereby obtaining 1.0 g (1.5 mmol, yield of 38%) of Intermediate 1-1. LC-MS m/z=678 (M+H)⁺.

4) Synthesis of Compound 1

At a temperature of 25° C., 0.8 g (1.2 mmol) of Intermediate 1-1, 10 ml of o-xylene, and 30 ml of benzonitrile were added to a reactor. Then, 0.5 g (1.2 mmol) of PtCl₂(NCPh)₂ was added thereto, and the mixture was heated at a temperature of 140° C. for 10 hours. Once the reaction was completed, the mixture was concentrated under reduced pressure, and purified by liquid chromatography, thereby obtaining 0.3 g (0.3 mmol, yield of 28%) of Compound 1. The obtained compound was identified by LC-MS analysis. LC-MS m/z=871 (M+H)⁺.

Synthesis Example 2: Synthesis of Compound 2

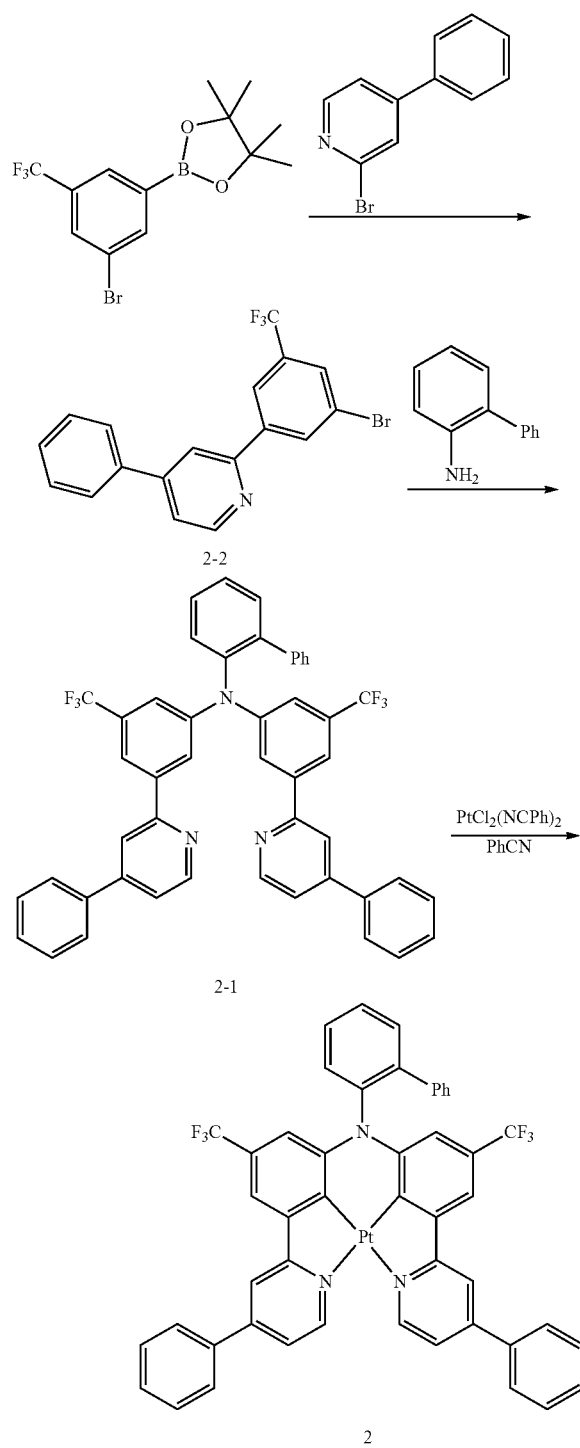

2-2

2-1

2

1) Synthesis of Intermediate 2-2

Intermediate 2-2 (yield of 60%) was synthesized in the same manner as Intermediate 1-2 in Synthesis Example 1, except that 3-bromo-5-(trifluoromethyl)benzeneboronic acid pinacol ester was used instead of Intermediate 1-3. The obtained compound was identified by LC-MS analysis. LC-MS m/z=378 (M+H)$^+$.

2) Synthesis of Intermediate 2-1

Intermediate 2-1 (yield of 42%) was synthesized in the same manner as Intermediate 1-1 in Synthesis Example 1, except that Intermediate 2-2 was used instead of Intermediate 1-2. The obtained compound was identified by LC-MS analysis. LC-MS m/z=764 (M+H)$^+$.

3) Synthesis of Compound 2

Compound 2 (yield of 35%) was synthesized in the same manner as Compound 1 in Synthesis Example 1, except that Intermediate 2-1 was used instead of Intermediate 1-1. The obtained compound was identified by LC-MS analysis. LC-MS m/z=957 (M+H)$^+$.

Synthesis Example 3: Synthesis of Compound 3

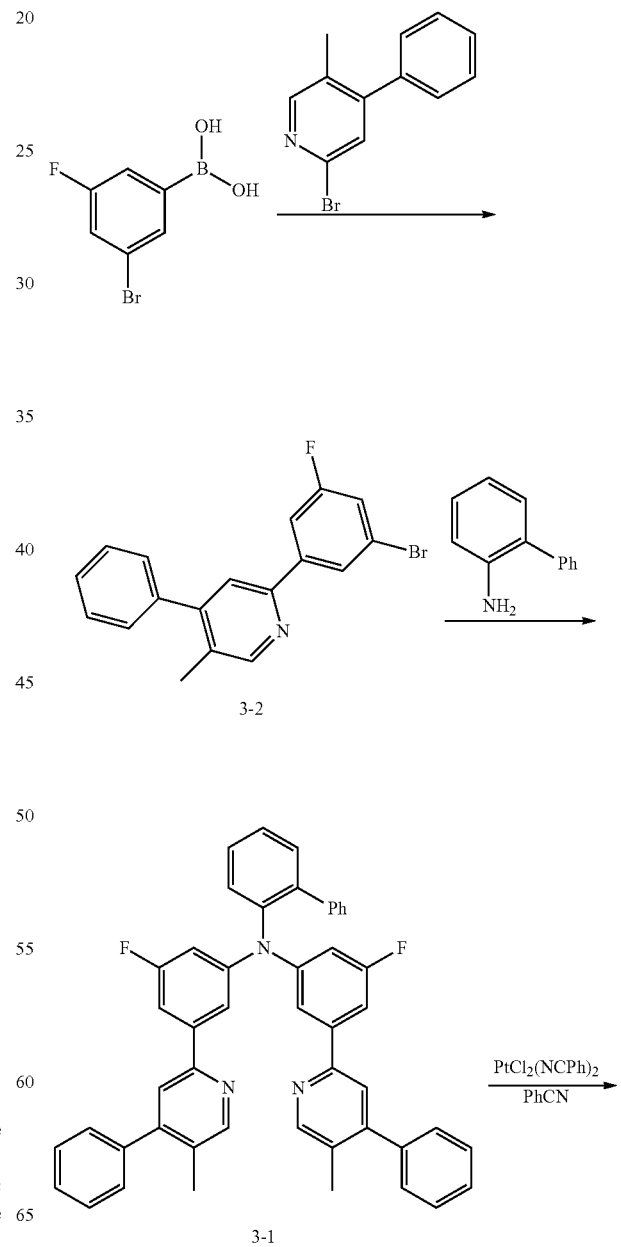

3-2

3-1

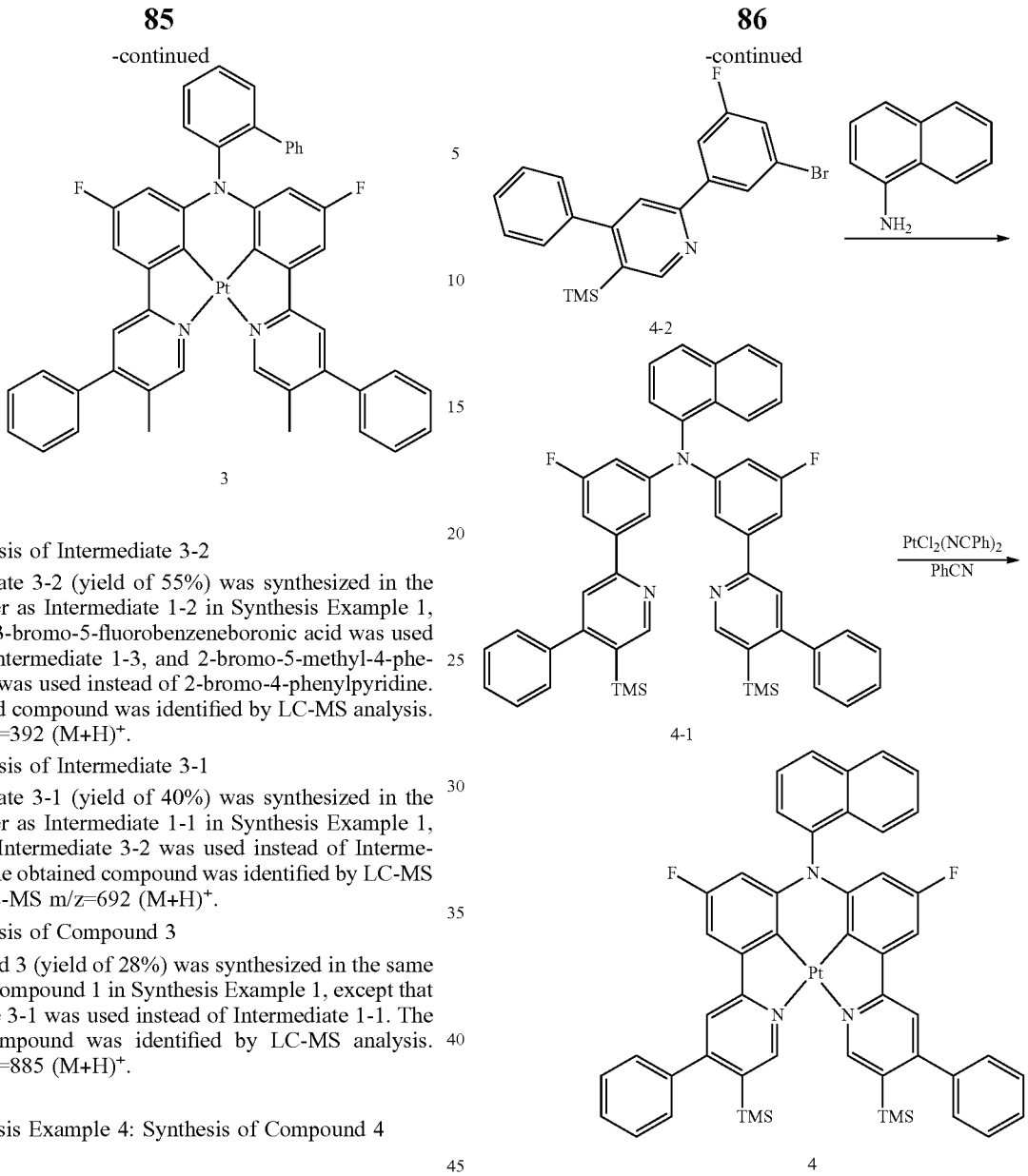

1) Synthesis of Intermediate 3-2

Intermediate 3-2 (yield of 55%) was synthesized in the same manner as Intermediate 1-2 in Synthesis Example 1, except that 3-bromo-5-fluorobenzeneboronic acid was used instead of Intermediate 1-3, and 2-bromo-5-methyl-4-phenylpyridine was used instead of 2-bromo-4-phenylpyridine. The obtained compound was identified by LC-MS analysis. LC-MS m/z=392 (M+H)$^+$.

2) Synthesis of Intermediate 3-1

Intermediate 3-1 (yield of 40%) was synthesized in the same manner as Intermediate 1-1 in Synthesis Example 1, except that Intermediate 3-2 was used instead of Intermediate 1-2. The obtained compound was identified by LC-MS analysis. LC-MS m/z=692 (M+H)$^+$.

3) Synthesis of Compound 3

Compound 3 (yield of 28%) was synthesized in the same manner as Compound 1 in Synthesis Example 1, except that Intermediate 3-1 was used instead of Intermediate 1-1. The obtained compound was identified by LC-MS analysis. LC-MS m/z=885 (M+H)$^+$.

Synthesis Example 4: Synthesis of Compound 4

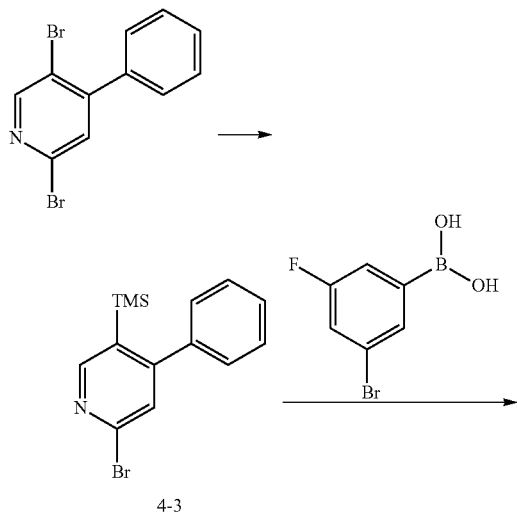

1) Synthesis of Intermediate 4-3

4.0 g (14.0 mmol) of 2-bromo-4-iodopyridine was dissolved in 60 ml of ethanol, and at a temperature of −78° C., 27.0 ml of 1.6 M n-BuLi (1.6 M solution in hexane) was slowly added thereto, and the resultant mixture was slowly stirred for about 2 hours. Thereafter, 6.1 ml (49.0 mmol) of chlorotrimethylsilane was slowly added thereto, followed by stirring for 1 hour at a temperature of −78° C. and for about 18 hours at least room temperature. Once the reaction was completed, 200 ml of ethyl acetate and 300 ml of distilled water were added thereto to perform an extraction. The organic layer was dried by using magnesium sulfate, and the solvent was evaporated under reduced pressure. Column chromatography was performed on the resultant product to obtain about 11.5 g (38.1 mmol, yield of 93%) of Intermediate 4-3. The obtained compound was identified by LC-MS analysis. LC-MS m/z=306 (M+H)$^+$.

2) Synthesis of Intermediate 4-2

Intermediate 4-2 (yield of 62%) was synthesized in the same manner as Intermediate 3-2 in Synthesis Example 3, except that Intermediate 4-3 was used instead of 2-bromo-5-methyl-4-phenylpyridine. The obtained compound was identified by LC-MS analysis. LC-MS m/z=400 (M+H)+.

3) Synthesis of Intermediate 4-1

Intermediate 4-1 (yield of 45%) was synthesized in the same manner as Intermediate 1-1 in Synthesis Example 1, except that Intermediate 4-2 was used instead of Intermediate 1-2, and 1-naphthylamine hydrochloride was used instead of 2-aminobiphenyl. The obtained compound was identified by LC-MS analysis. LC-MS m/z=782 (M+H)+.

4) Synthesis of Compound 4

Compound 4 (yield of 7%) was synthesized in the same manner as Compound 1 in Synthesis Example 1, except that Intermediate 4-1 was used instead of Intermediate 1-1, and the heating was performed at a temperature of 120° C. for 3 days. The obtained compound was identified by LC-MS analysis. LC-MS m/z=975 (M+H)+.

Synthesis Example 5: Synthesis of Compound 5

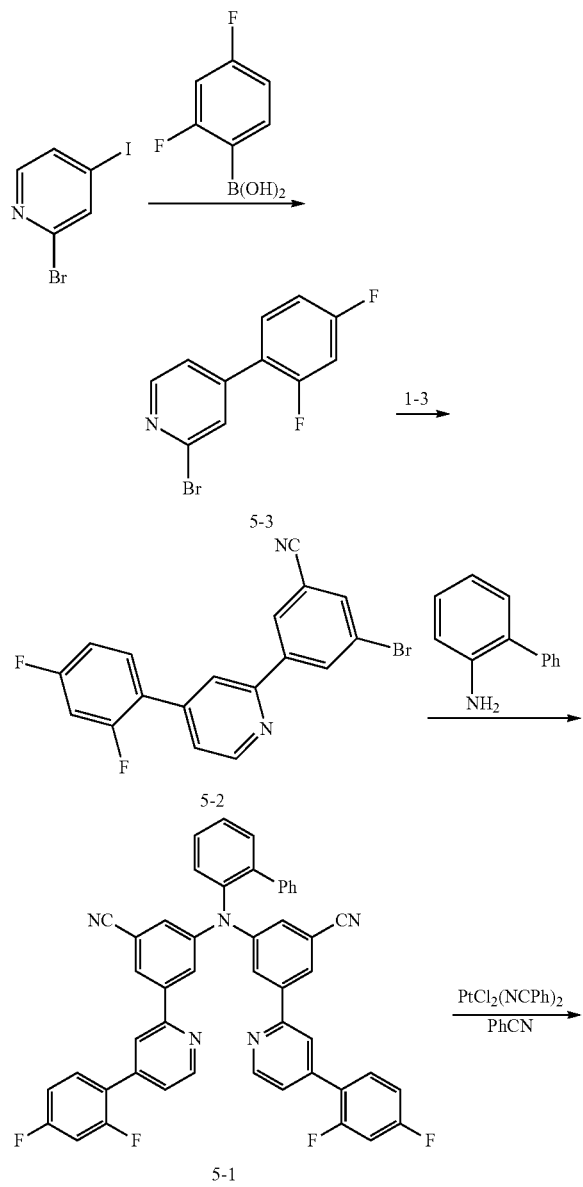

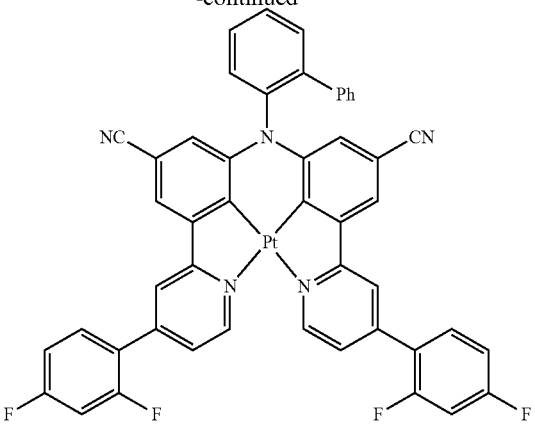

1) Synthesis of Intermediate 5-3

4.0 g (14.0 mmol) of 2-bromo-4-iodopyridine and 2.4 g (15.5 mmol) of 2,4-difluorophenyl boronic acid were added to a reactor, and 60 ml of 95% ethanol (ethanol 95%+water 5%) was added thereto. Then, 0.8 g (0.7 mmol) of Pd(PPh$_3$)$_4$ and 3.0 g (28.0 mmol) of sodium carbonate were added thereto, and the resultant mixture was heated under reflux at a temperature of 70° C. for 14 hours. Once the reaction was completed, the mixture was concentrated under reduced pressure, dissolved in 120 ml of dichloromethane, and filtered by passing through diatomite earth. 60 ml of water was added to an organic layer obtained therefrom to perform an extraction. The combined organic extracts were dried by using magnesium sulfate, and the solvent was performed under reduced pressure. The resultant product was purified by column chromatography to obtain about 1.8 g (6.6 mmol, yield of 47%) of Intermediate 5-3. The obtained compound was identified by LC-MS analysis. LC-MS m/z=270 (M+H)+.

2) Synthesis of Intermediate 5-2

Intermediate 5-2 (yield of 19%) was synthesized in the same manner as Intermediate 1-2 in Synthesis Example 1, except that Intermediate 5-3 was used instead of 2-bromo-4-phenylpyridine. The obtained compound was identified by LC-MS analysis. LC-MS m/z=371 (M+H)+.

3) Synthesis of Intermediate 5-1

Intermediate 5-1 (yield of 25%) was synthesized in the same manner as Intermediate 1-1 in Synthesis Example 1, except that Intermediate 5-2 was used instead of Intermediate 1-2. The obtained compound was identified by LC-MS analysis. LC-MS m/z=750 (M+H)+.

4) Synthesis of Compound 5

Compound 5 (yield of 40%) was synthesized in the same manner as Compound 1 in Synthesis Example 1, except that Intermediate 5-1 was used instead of Intermediate 1-1. The obtained compound was identified by LC-MS analysis. LC-MS m/z=943 (M+H)+.

Synthesis Example 6: Synthesis of Compound 6

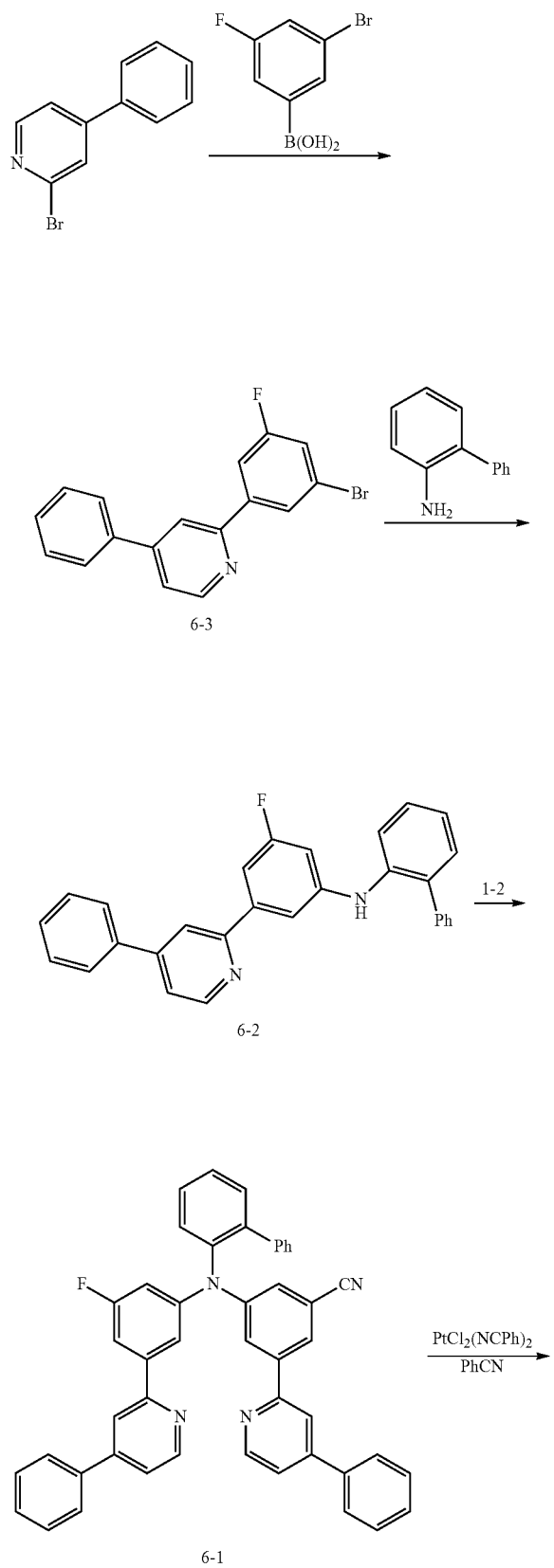

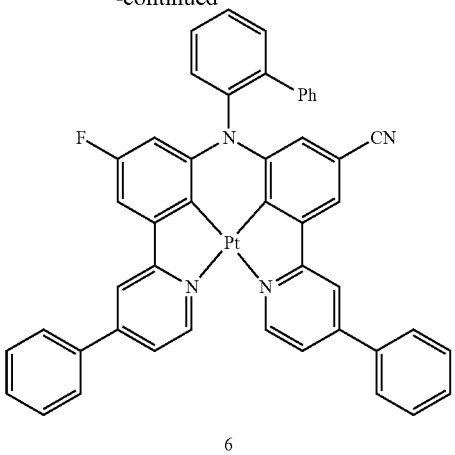

1) Synthesis of Intermediate 6-3

Intermediate 6-3 (yield of 66%) was synthesized in the same manner as Intermediate 3-2 in Synthesis Example 3, except that 2-bromo-4-phenylpyridine was used instead of 2-bromo-5-methyl-4-phenylpyridine. The obtained compound was identified by LC-MS analysis. LC-MS m/z=328 (M+H)$^+$.

2) Synthesis of Intermediate 6-2

1.5 g (4.6 mmol) of Intermediate 6-3 and 60 ml of toluene were added to a reactor. Then, 0.85 g (5.1 mmol) of 2-aminobiphenyl, 0.2 g (0.2 mmol) of Pd$_2$(dba)$_3$, 0.25 g (0.6 mmol) of tri-butyl phosphine (50 wt % in toluene), and 1.3 g (13.8 mmol) of sodium butoxide were added thereto. The resultant mixture was heated under reflux at a temperature of 110° C. for 18 hours. Once the reaction completed, the mixture was filtered by passing through diatomite earth. The organic layer was distilled under reduced pressure and purified by liquid chromatography to obtain 1.5 g (3.7 mmol, yield of 80%) of Intermediate 6-2. LC-MS m/z=417 (M+H)$^+$.

3) Synthesis of Intermediate 6-1

1.0 g (2.4 mmol) of Intermediate 6-2 and 60 ml of toluene were added to a reactor. Then, 0.84 g (2.5 mmol) of Intermediate 1-2, 0.1 g (0.17 mmol) of Pd(dba)$_2$, 0.14 g (0.34 mmol) of tri-butyl phosphine (50 wt % in toluene), and 0.7 g (7.2 mmol) of sodiumbutoxide were added thereto, and the resultant mixture was heated under reflux at a temperature of 110° C. for 24 hours. Once the reaction was completed, the mixture was filtered by passing through diatomite earth. The organic layer was distilled under reduced pressure, and purified by liquid chromatography, thereby obtaining 0.7 g (1.0 mmol, yield of 45%) of Intermediate 6-1. LC-MS m/z=671 (M+H)$^+$.

4) Synthesis of Compound 6

Compound 6 (yield of 40%) was synthesized in the same manner as Compound 1 in Synthesis Example 1, except that Intermediate 6-1 was used instead of Intermediate 1-1. The obtained compound was identified by LC-MS analysis. LC-MS m/z=864 (M+H)$^+$.

Synthesis Example 7: Synthesis of Compound 7

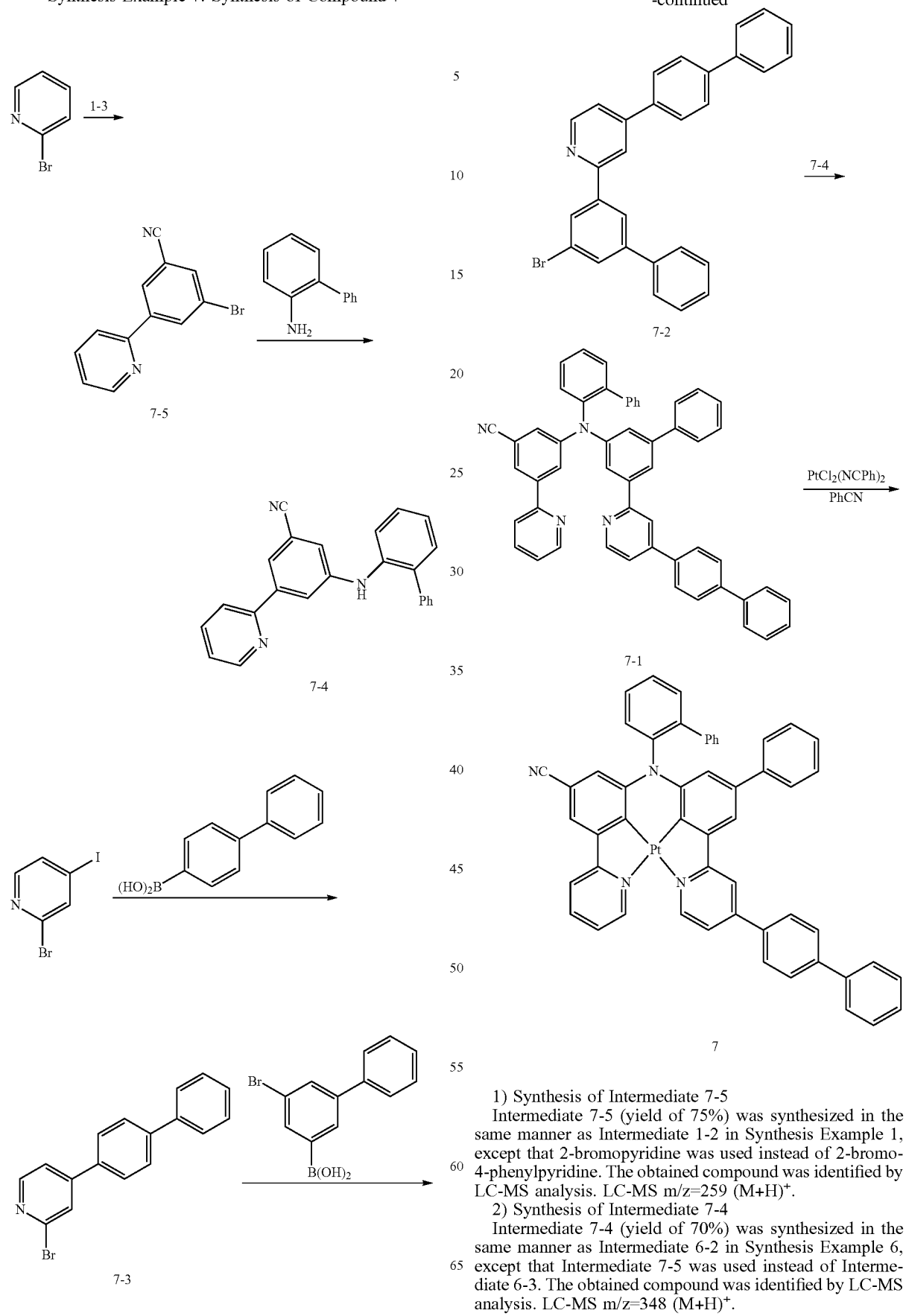

1) Synthesis of Intermediate 7-5

Intermediate 7-5 (yield of 75%) was synthesized in the same manner as Intermediate 1-2 in Synthesis Example 1, except that 2-bromopyridine was used instead of 2-bromo-4-phenylpyridine. The obtained compound was identified by LC-MS analysis. LC-MS m/z=259 (M+H)$^+$.

2) Synthesis of Intermediate 7-4

Intermediate 7-4 (yield of 70%) was synthesized in the same manner as Intermediate 6-2 in Synthesis Example 6, except that Intermediate 7-5 was used instead of Intermediate 6-3. The obtained compound was identified by LC-MS analysis. LC-MS m/z=348 (M+H)$^+$.

3) Synthesis of Intermediate 7-3

Intermediate 7-3 (yield of 83%) was synthesized in the same manner as Intermediate 5-3 in Synthesis Example 5, except that 4-biphenylboronic acid was used instead of 2,4-difluorophenyl boronic acid. The obtained compound was identified by LC-MS analysis. LC-MS m/z=310 (M+H)$^+$.

4) Synthesis of Intermediate 7-2

Intermediate 7-2 (yield of 80%) was synthesized in the same manner as Intermediate 1-2 in Synthesis Example 1, except that Intermediate 7-3 was used instead of 2-bromo-4-phenylpyridine, and (5-bromo-[1,1'-biphenyl]-3-yl)boronic acid was used instead of Intermediate 1-3. The obtained compound was identified by LC-MS analysis. LC-MS m/z=462 (M+H)$^+$.

5) Synthesis of Intermediate 7-1

Intermediate 7-1 (yield of 68%) was synthesized in the same manner as Intermediate 6-1 in Synthesis Example 6, except that Intermediate 7-4 was used instead of Intermediate 6-2, and Intermediate 7-2 was used instead of Intermediate 1-2. The obtained compound was identified by LC-MS analysis. LC-MS m/z=729 (M+H)$^+$.

6) Synthesis of Compound 7

Compound 7 (yield of 50%) was synthesized in the same manner as Compound 1 in Synthesis Example 1, except that Intermediate 7-1 was used instead of Intermediate 1-1. The obtained compound was identified by LC-MS analysis. LC-MS m/z=922 (M+H)$^+$.

Synthesis Example 8: Synthesis of Compound 8

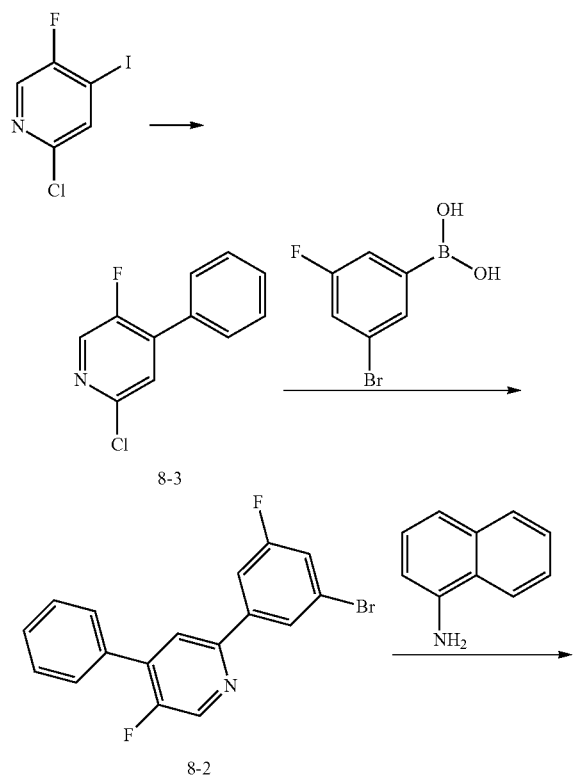

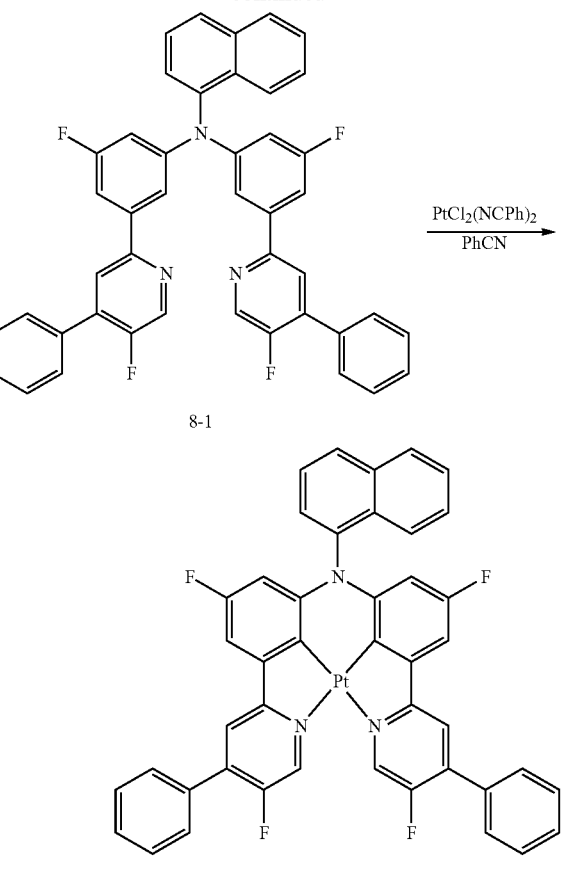

1) Synthesis of Intermediate 8-3

Intermediate 8-3 (yield of 85%) was synthesized in the same manner as Intermediate 5-3 in Synthesis Example 5, except that 2-chloro-5-fluoro-4-iodopyridine was used instead of 2-bromo-4-iodopyridine, and phenyl boronic acid was used instead of 2,4-difluorophenyl boronic acid. The obtained compound was identified by LC-MS analysis. LC-MS m/z=208 (M+H)$^+$.

2) Synthesis of Intermediate 8-2

Intermediate 8-2 (yield of 50%) was synthesized in the same manner as Intermediate 4-2 in Synthesis Example 4, except that Intermediate 8-3 was used instead of Intermediate 4-3. The obtained compound was identified by LC-MS analysis. LC-MS m/z=346 (M+H)$^+$.

3) Synthesis of Intermediate 8-1

Intermediate 8-1 (yield of 38%) was synthesized in the same manner as Intermediate 1-1 in Synthesis Example 1, except that Intermediate 8-2 was used instead of Intermediate 1-2, and 1-naphthylamine hydrochloride was used instead of 2-aminobiphenyl. The obtained compound was identified by LC-MS analysis. LC-MS m/z=674 (M+H)$^+$.

4) Synthesis of Compound 8

Compound 8 (yield of 12%) was synthesized in the same manner as Compound 1 in Synthesis Example 1, except that Intermediate 8-1 was used instead of Intermediate 1-1. The obtained compound was identified by LC-MS analysis. LC-MS m/z=867 (M+H)$^+$.

Synthesis Example 9: Synthesis of Compound 9

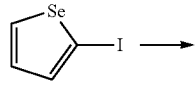

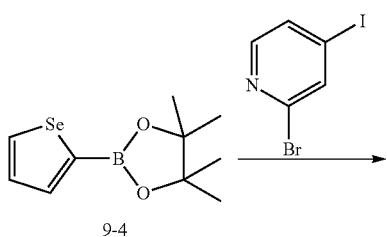

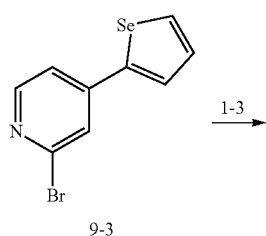

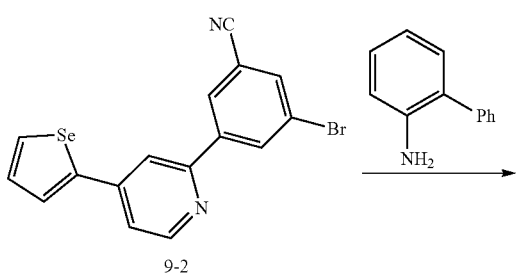

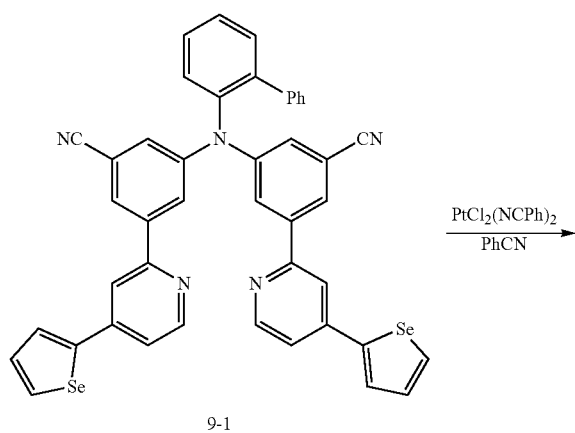

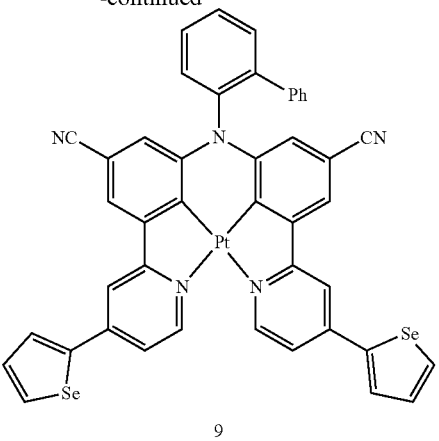

1) Synthesis of Intermediate 9-4

11 g (42.2 mmol) of 2-iodoselenophene was dissolved in 200 ml of diethyl ether, and then, at a temperature of −78° C., 27.0 ml of n-BuLi (1.6 M solution in hexane) was slowly added thereto, and the resultant mixture was stirred for about 2 hours. Then, 10.0 ml (50.6 mmol) of 2-iso-propoxy-4,4,5,5-tetramethyl-1,3,2-dioxaborolane was slowly added thereto and stirred for 1 hour at a temperature of −78° C. and for 16 hours at room temperature. Once the reaction was completed, 200 ml of ethyl acetate and 300 ml of distilled water were added thereto to perform an extraction. The organic layer was dried by using magnesium sulfate, and the solvent was removed under reduced pressure. The resultant product was purified by column chromatography to obtain about 9.2 g (35.9 mmol, yield of 85%) of Intermediate 9-4. The obtained compound was identified by LC-MS analysis. LC-MS m/z=259 (M+H)$^+$.

2) Synthesis of Intermediate 9-3

Intermediate 9-3 (yield of 22%) was synthesized in the same manner as Intermediate 5-3 in Synthesis Example 5, except that Intermediate 9-4 was used instead of 2,4-difluorophenyl boronic acid. The obtained compound was identified by LC-MS analysis. LC-MS m/z=287 (M+H)$^+$.

3) Synthesis of Intermediate 9-2

Intermediate 9-2 (yield of 40%) was synthesized in the same manner as Intermediate 1-2 in Synthesis Example 1, except that Intermediate 9-3 was used instead of 2-bromo-4-phenylpyridine. The obtained compound was identified by LC-MS analysis. LC-MS m/z=389 (M+H)$^+$.

4) Synthesis of Intermediate 9-1

Intermediate 9-1 (yield of 20%) was synthesized in the same manner as Intermediate 1-1 in Synthesis Example 1, except that Intermediate 9-2 was used instead of Intermediate 1-2. The obtained compound was identified by LC-MS analysis. LC-MS m/z=786 (M+H)$^+$.

5) Synthesis of Compound 9

Compound 9 (yield of 13%) was synthesized in the same manner as Compound 1 in Synthesis Example 1, except that Intermediate 9-1 was used instead of Intermediate 1-1. The obtained compound was identified by LC-MS analysis. LC-MS m/z=979 (M+H)$^+$.

Example 1

As an anode, a substrate with ITO/Ag/ITO deposited thereon at thicknesses of 70/1000/70 Å, respectively, was cut to a size of 50 mm×50 mm×0.5 mm (mm=millimeters), followed by a cleaning process including 5 minutes of sonication with iso-propyl alcohol and 5 minutes of sonication with pure water, and 30 minutes of exposure to ultraviolet light, and further exposure to ozone.

Then, 2-TNATA was vacuum-deposited on the substrate to form a hole injection layer having a thickness of 600 Angstroms (Å), and then, 4'-bis[N-(1-naphthyl)-N-phenylamino]biphenyl (hereinafter referred to as NPB) was vacuum-deposited on the hole injection layer to form a hole transport layer having a thickness of 1,350 Å.

Compound 1 (dopant) and CBP (host) were co-deposited on the hole transport layer at a weight ratio of 95:5 to form an emission layer having a thickness of 400 Å.

BCP was vacuum-deposited on the emission layer to form a hole blocking layer having a thickness of 50 Å, and then, $Alq_3$ was deposited on the hole blocking layer to form an electron transport layer having a thickness of 350 Å, and LiF was deposited on the electron transport layer to form an electron injection layer having a thickness of 10 Å. Then, MgAg was vacuum-deposited thereon at a weight ratio of 90:10 to form an electrode having a thickness of 120 Å, thereby completing the manufacture of an organic light-emitting device.

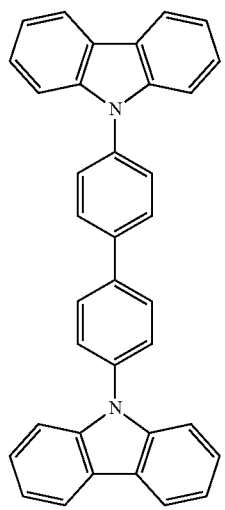

CBP

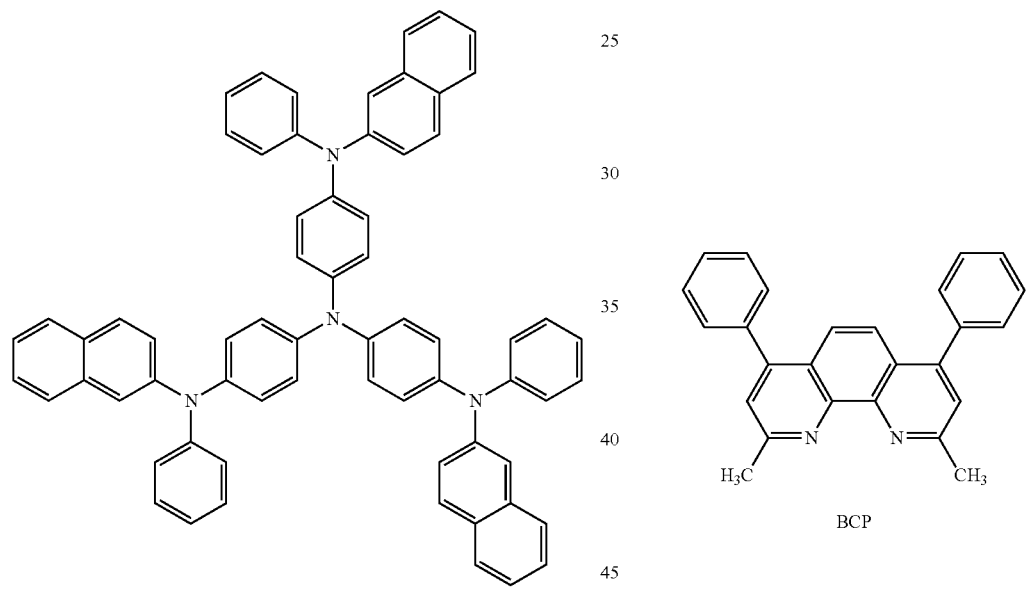

2-TNATA

NPB

BCP

Examples 2 to 5 and Comparative Examples A to D

Organic light-emitting devices were manufactured in the same manner as in Example 1, except that in forming an emission layer, for use as a dopant, corresponding compounds shown in Table 2 were used instead of Compound 1.

Evaluation Example 1: Evaluation of Characteristics of Organic Light-Emitting Devices Driving voltage, current density, luminance, luminescent efficiency, emission color, half width, color coordinates, and a lifespan of each of the organic light-emitting devices manufactured according to Examples 1 to 5 and Comparative Examples A to D were evaluated, and results thereof are shown in Table 2 below. This evaluation was performed using a current-voltage meter (Keithley 2400) and luminance meter (Minolta Cs-1,000A).

TABLE 2

| | Dopant | Driving Voltage (V) | Current Density (mA/cm²) | Brightness (cd/m²) | Efficiency (cd/A) | Emission color | Half width (nm) | Color coordinate | $LT_{97}$ (hr) |
|---|---|---|---|---|---|---|---|---|---|
| Example 1 | Compound 1 | 4.8 | 10 | 3,030 | 30.3 | Red | 43 | 0.66, 0.34 | 1500 |
| Example 2 | Compound 2 | 4.7 | 10 | 3,210 | 32.1 | Red | 52 | 0.64, 0.33 | 1000 |
| Example 3 | Compound 4 | 4.7 | 10 | 3,350 | 33.5 | Red | 46 | 0.62, 0.32 | 1700 |
| Example 4 | Compound 5 | 4.8 | 10 | 2,990 | 29.9 | Red | 42 | 0.68, 0.34 | 1300 |
| Example 5 | Compound 7 | 4.7 | 10 | 2,830 | 28.3 | Red | 55 | 0.69, 0.32 | 1000 |
| Comparative Example A | Compound A | 5.8 | 10 | 2,237 | 22.3 | Red | 76 | 0.65, 0.31 | 500 |
| Comparative Example B | Compound B | 7.3 | 10 | 2,212 | 22.1 | Red | 85 | 0.67, 0.32 | 65 |
| Comparative Example C | Compound C | 5.8 | 10 | 2,200 | 22.0 | Red | 78 | 0.66, 0.32 | 350 |
| Comparative Example D | Compound D | 5.7 | 10 | 1,605 | 16.0 | Blue | 80 | 0.20, 0.28 | 1 |

A

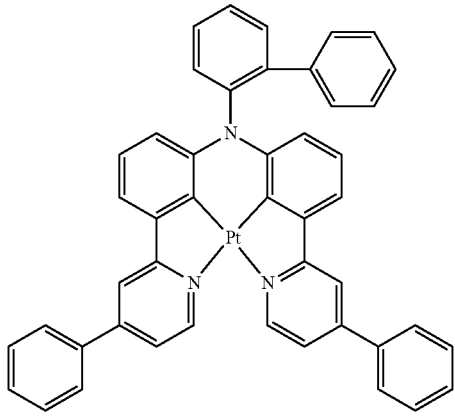

B

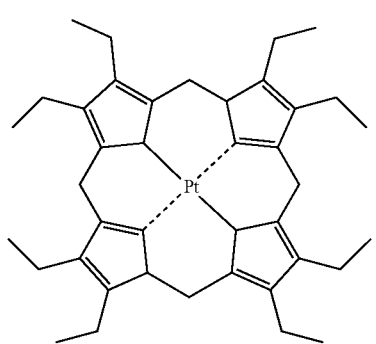

C

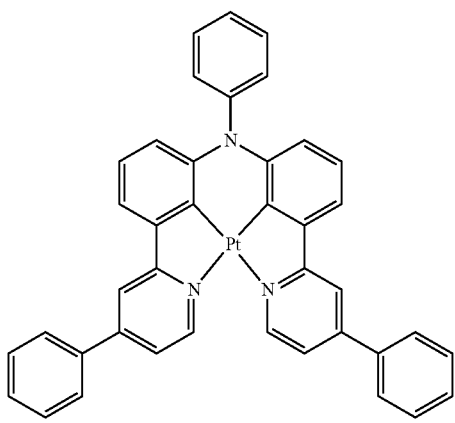

-continued

D

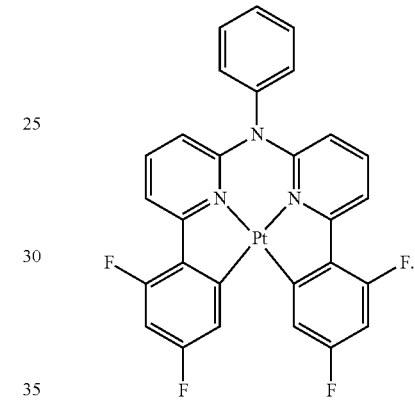

Referring to Table 2, it was determined that the organic light-emitting devices manufactured according to Examples 1 to 5 had a lower driving voltage, higher luminance, higher efficiency, higher color-purity, and a longer lifespan than the organic light-emitting devices manufactured according to Comparative Examples A to D.

As described above, the organometallic compounds according to embodiments of the present disclosure have excellent electrical characteristics and thermal stability, and, accordingly, organic light-emitting devices including such organometallic compounds may have excellent driving voltage, luminescent efficiency, power efficiency, color purity, and lifespan characteristics. Also, due to excellent phosphorescent luminescence characteristics, such organometallic compounds may provide a diagnostic composition having high diagnostic efficiency.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:
1. An organometallic compound selected from Compounds 3 to 9:
3
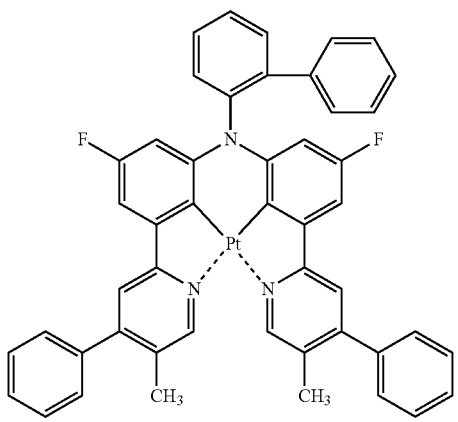
4
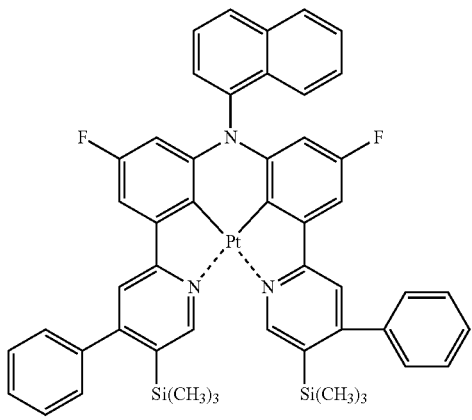
5
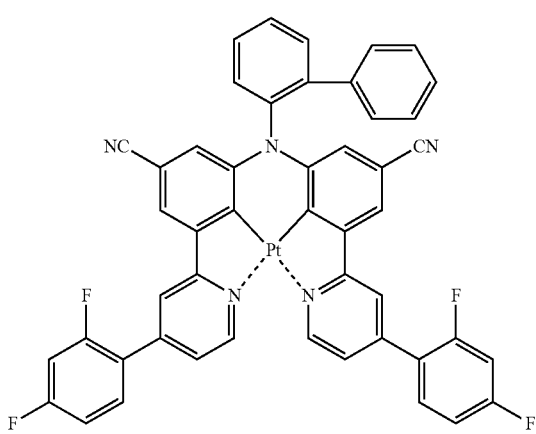
6
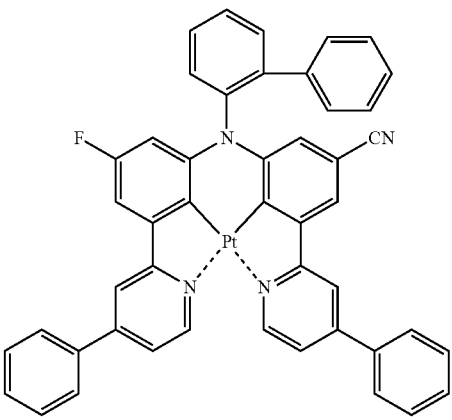
7
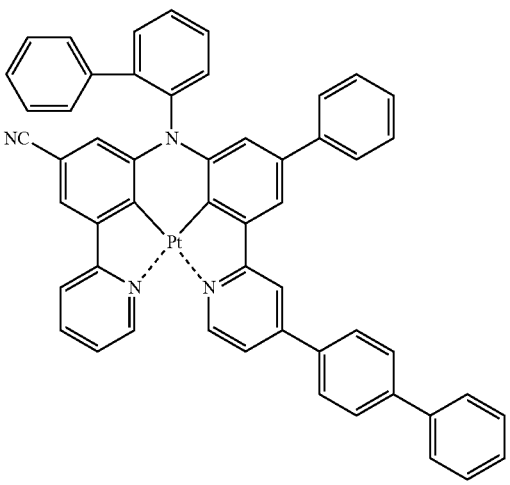
8
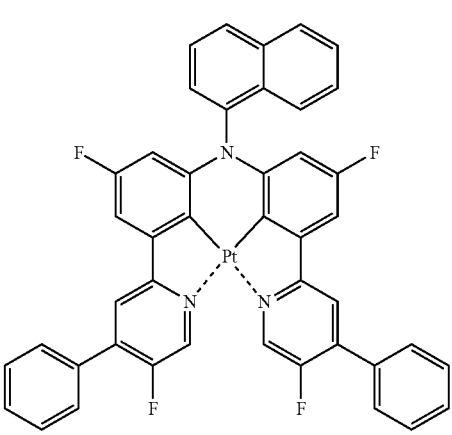

-continued
9
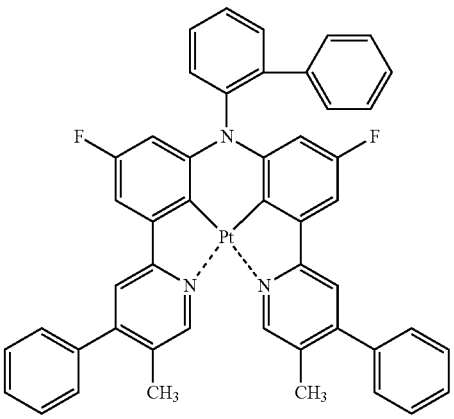
2. An organic light-emitting device comprising:
a first electrode;
a second electrode; and
an organic layer disposed between the first electrode and the second electrode, wherein the the organic layer comprises an emission layer and at least one organometallic compound selected from Compounds 1-9:
1
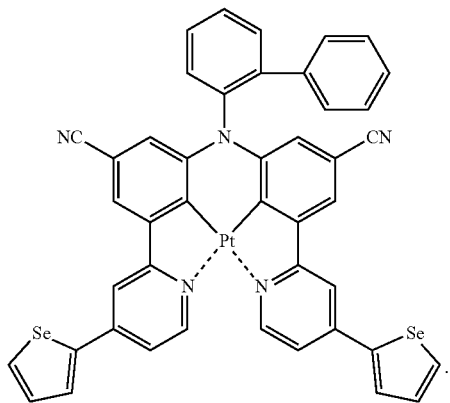
2
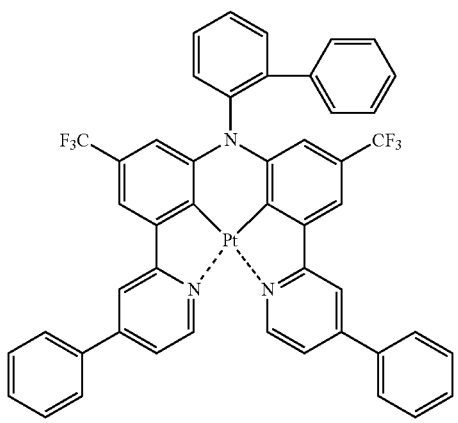
-continued
3
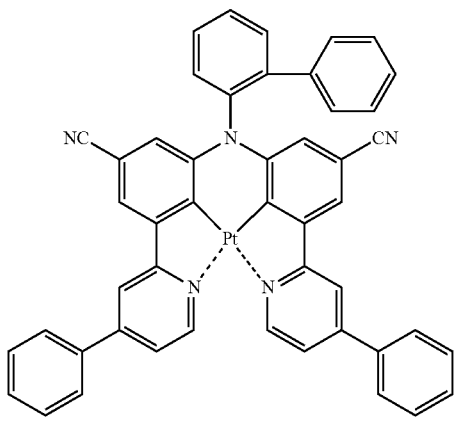
4
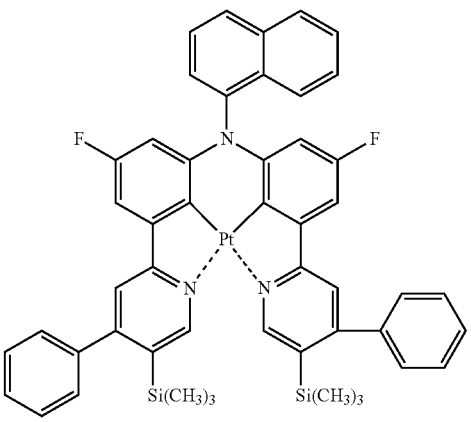
5
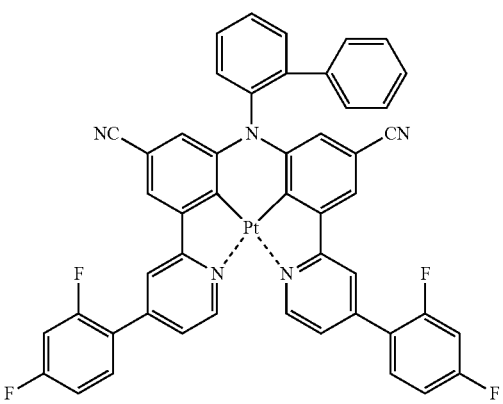

105
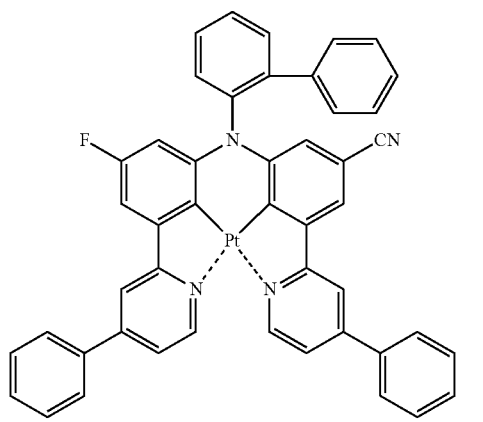
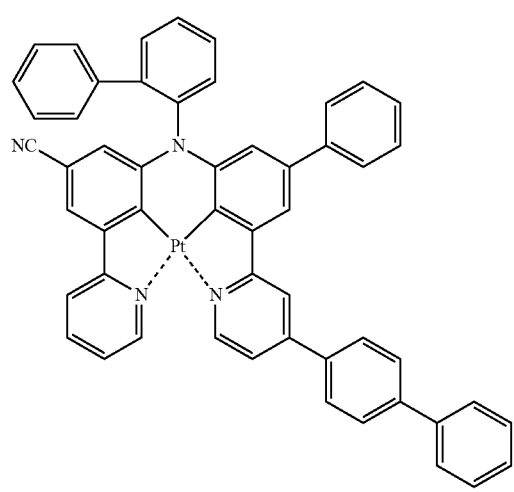
106
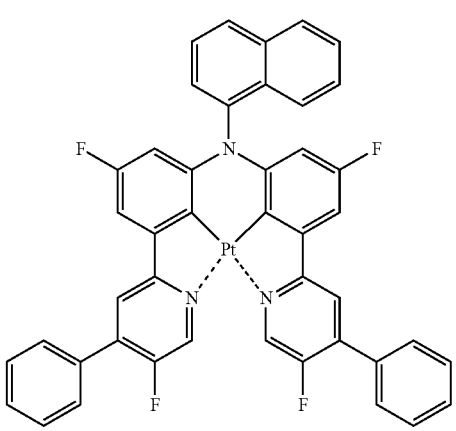
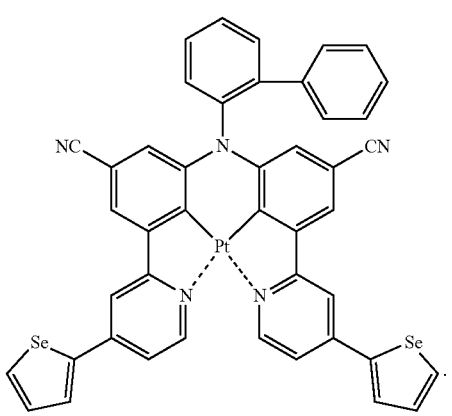
* * * * *